United States Patent
Tanaka et al.

(10) Patent No.: US 8,391,077 B2
(45) Date of Patent: Mar. 5, 2013

(54) NONVOLATILE SEMICONDUCTOR MEMORY DEVICE

(75) Inventors: Rieko Tanaka, Yokohama (JP); Koichi Fukuda, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 243 days.

(21) Appl. No.: 12/875,662

(22) Filed: Sep. 3, 2010

(65) Prior Publication Data
US 2011/0063922 A1    Mar. 17, 2011

(30) Foreign Application Priority Data
Sep. 16, 2009 (JP) ................... 2009-214544

(51) Int. Cl.
*G11C 11/34* (2006.01)
(52) U.S. Cl. .............. 365/185.25; 365/194; 365/185.03; 365/185.18; 365/185.23
(58) Field of Classification Search ............. 365/185.25, 365/185, 194
See application file for complete search history.

(56) References Cited

U.S. PATENT DOCUMENTS

| | | | |
|---|---|---|---|
| 7,324,393 B2 * | 1/2008 | Chan et al. ............ | 365/205 |
| 7,643,347 B2 | 1/2010 | Abiko et al. | |
| 7,898,871 B2 * | 3/2011 | Byeon ................ | 365/185.25 |
| 8,125,829 B2 * | 2/2012 | Tanzawa .................. | 365/185.13 |
| 2010/0329062 A1 * | 12/2010 | Campbell et al. ............ | 365/226 |
| 2012/0155174 A1 * | 6/2012 | Cornwell et al. ......... | 365/185.09 |

FOREIGN PATENT DOCUMENTS

| | | |
|---|---|---|
| JP | 5-62484 | 3/1993 |
| JP | 2000-82294 | 3/2000 |
| JP | 2009-151886 | 7/2009 |
| WO | WO 03/073430 A1 | 9/2003 |

OTHER PUBLICATIONS

Office Action issued Dec. 20, 2011 in Japan Application No. 2009-214544 (With English Translation).
Japanese Office Action issued Apr. 3, 2012, in Japan Patent Application No. 2009-214544 (with English translation).

* cited by examiner

*Primary Examiner* — Fernando Hidalgo
(74) *Attorney, Agent, or Firm* — Oblon, Spivak, McClelland, Maier & Neustadt, L.L.P.

(57) ABSTRACT

Nonvolatile semiconductor memory device according to one embodiment includes: a plurality of planes; a memory cell array provided in the plurality of planes respectively; bit lines; and a control circuit. Each memory cell array is configured as an array of NAND cell units each including a memory string. The memory string includes a plurality of nonvolatile memory cells connected in series. The bit lines are connected to a first end of the NAND cell units, respectively. The control circuit controls a write operation of charging the bit lines up to a certain voltage value, and then setting data in the nonvolatile memory cells to a certain threshold voltage distribution state. The control circuit is configured to be capable of executing an operation of charging the bit lines in a write operation by varying timings of starting charging the bit lines among the plurality of planes.

13 Claims, 19 Drawing Sheets

FIG. 6    <COMPARATIVE EXAMPLE>
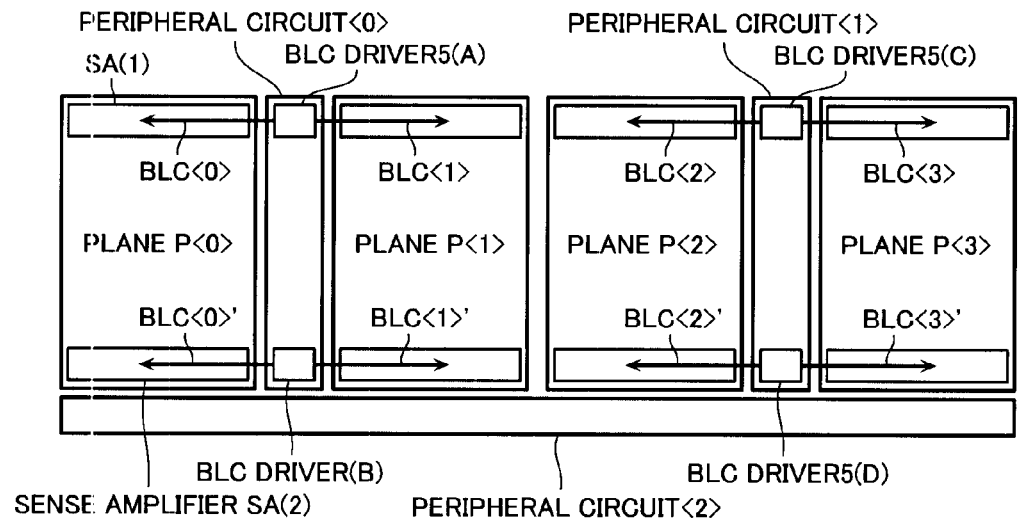
FIG. 7    <COMPARATIVE EXAMPLE>
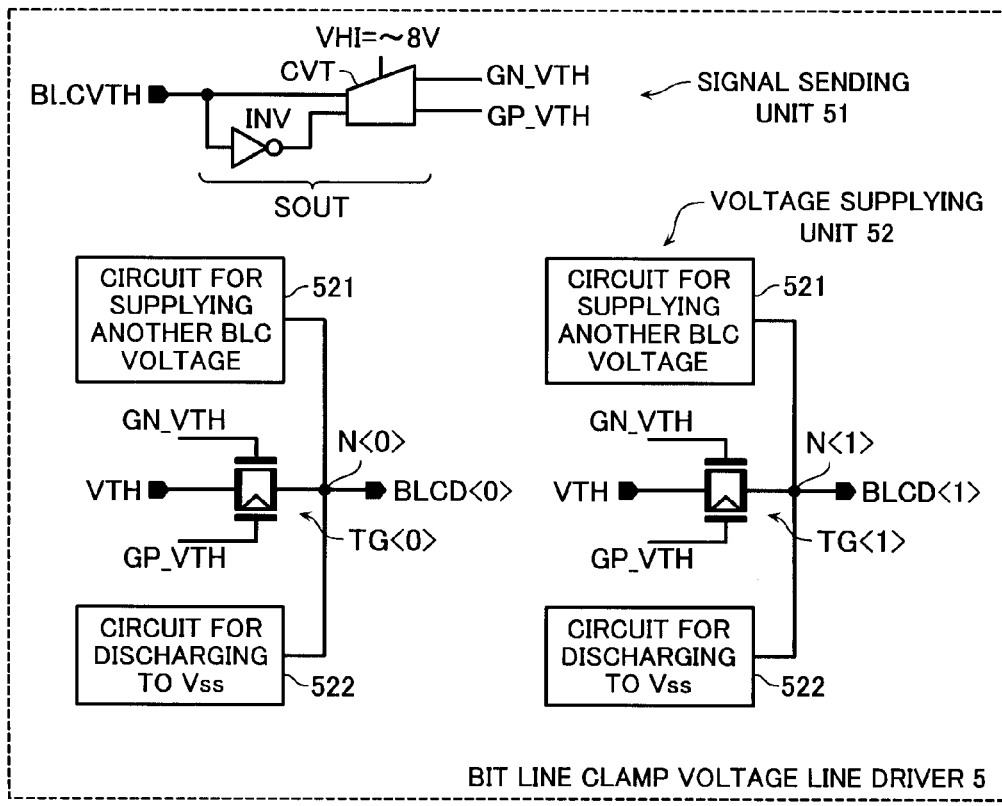

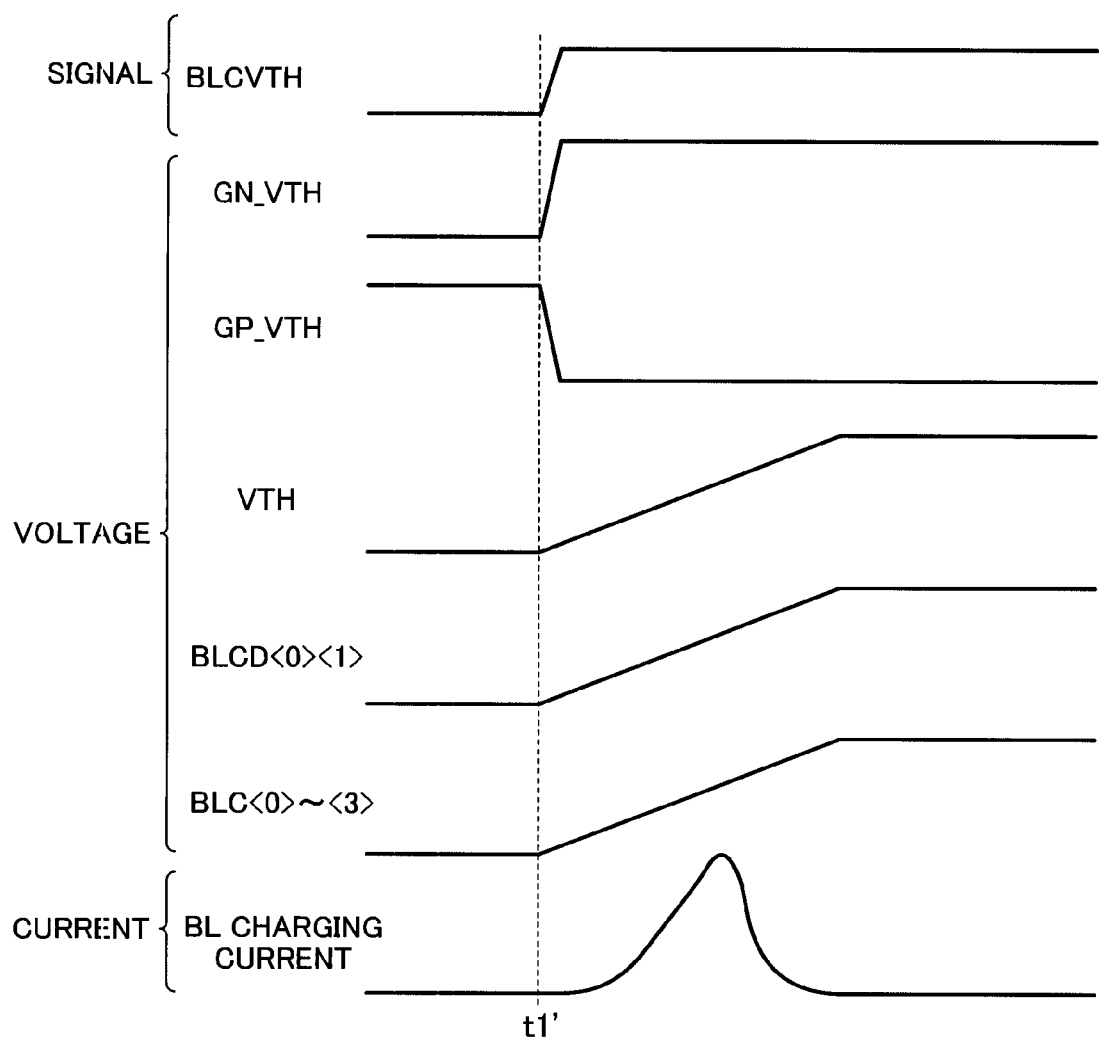

FIG. 9B
TWO-PLANE SELECTION
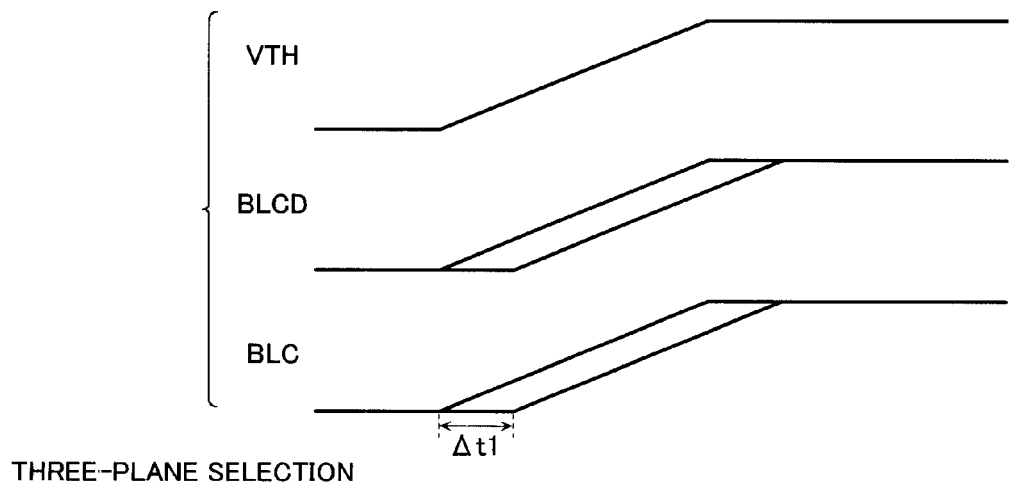
THREE-PLANE SELECTION
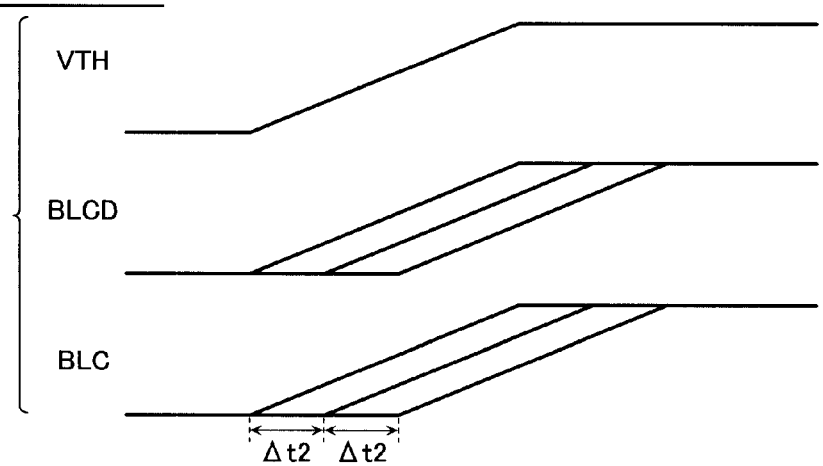
FOUR-PLANE SELECTION
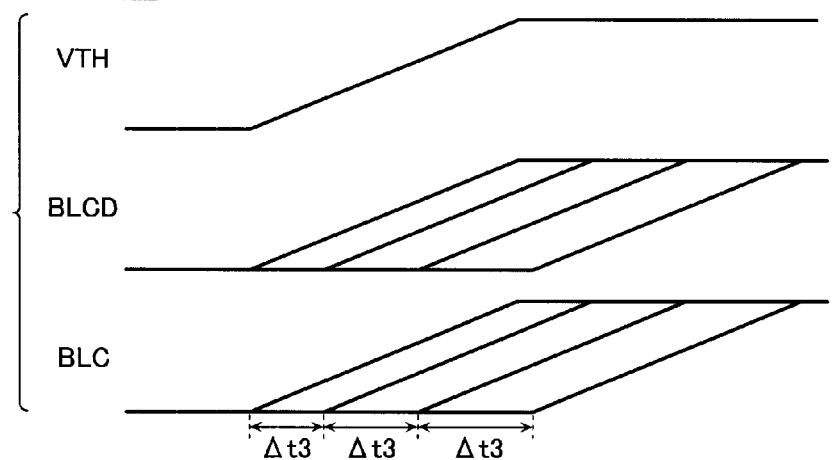

FIG. 12
(COMPARATIVE EXAMPLE)
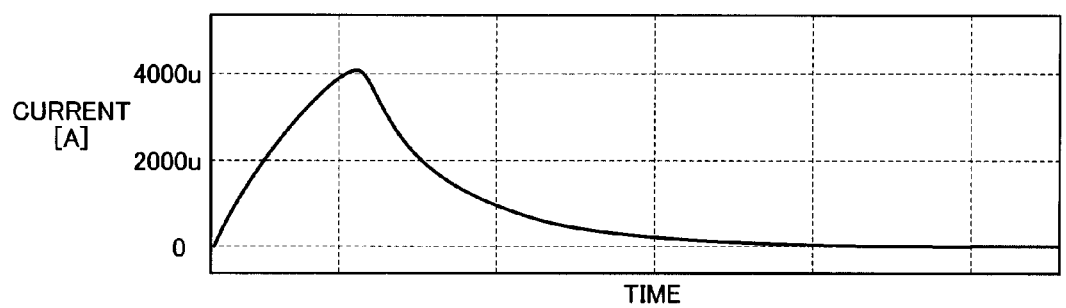
(EMBODIMENT A)
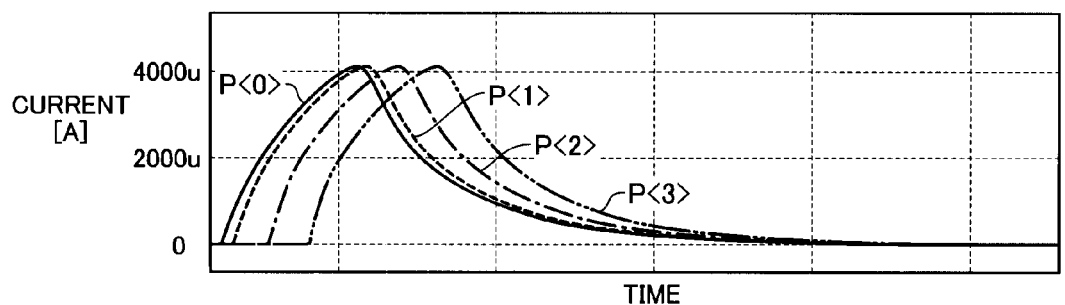
(EMBODIMENT B)
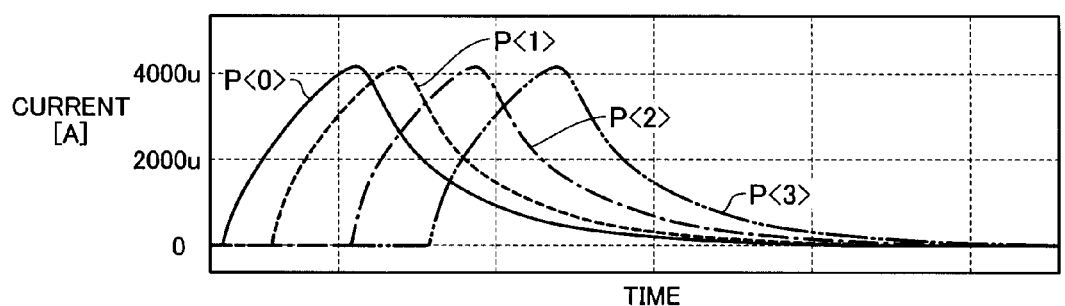
(STATES OF CURRENTS ADDED)
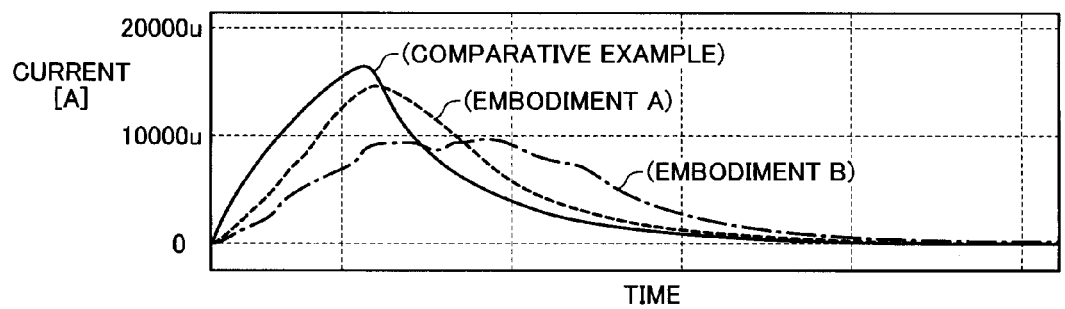

NONVOLATILE SEMICONDUCTOR MEMORY DEVICE

CROSS REFERENCE TO RELATED APPLICATION

This application is based upon and claims the benefit of priority from prior Japanese Patent Application No. 2009-214544, filed on Sep. 16, 2009, the entire contents of which are incorporated herein by reference.

BACKGROUND

1. Field

Embodiments described herein relate generally to a nonvolatile semiconductor memory device configured by using electrically rewritable nonvolatile memory cells.

2. Description of the Related Art

A NAND type flash memory is known as a nonvolatile semiconductor memory device that is electrically rewritable and suitable for high integration. In a NAND type flash memory, a NAND cell unit is configured by series-connecting a plurality of memory cells in a manner that a source diffusion layer of one memory cell is shared as a drain diffusion layer of its adjoining memory cell. Both ends of the NAND cell unit are connected to a bit line and a source line via select gate transistors respectively. Such a NAND cell unit configuration enables a smaller unit cell area and a larger memory capacity than those of a NOR type memory.

A sense amplifier of a semiconductor memory device such as a NAND type flash memory determines data basically by detecting the presence or absence or the level of a cell current that flows in accordance with the data in a memory cell. The sense amplifier is normally connected to a data line (bit line) connected to a plurality of memory cells. The sensing scheme of the sense amplifier is roughly divided into a voltage sensing type and a current sensing type.

For example, a voltage sensing type sense amplifier precharges a bit line disconnected from the memory cells to a certain voltage, causes a selected memory cell to discharge the bit line, and senses the discharge state of the bit line at a sense node connected to the bit line. In the data sense, the bit, line is disconnected from a current source load, and the bit line voltage determined by the cell data is sensed. On the other hand, a current sensing type sense amplifier executes data sense by causing a reading current to flow into a memory cell through a bit line. Determination of data is finally done by detecting a difference in voltage at a sense node that is connected to a bit line. The difference in voltage at the sense node is caused by a difference in cell current.

The voltage sensing type sense amplifier and the current sensing type sense amplifier generally have the following merits and demerits. The voltage sensing type senses a discharge state of the bit line after it is precharged, and hence consumes less electricity. However, a large-capacity memory with a large bit line capacitance takes a long time to charge and discharge the bit line, and hence it is difficult to perform a fast sense operation. Further, the voltage sensing type causes a relatively large amplitude of the bit line voltage depending on cell data, and thus noise between adjoining bit lines becomes a problem.

On the other hand, the current sensing type sense amplifier can realize a fast sense operation by executing data sense by causing a reading current to flow into a memory cell through the bit line. A clamp transistor disposed between the bit line and a sense amplifier controls the bit line potential to a constant voltage all the time during the sense operation, thereby eliminating influence between adjoining bit lines. Accordingly, an ABL (All Bit Line) type sense amplifier is used for the current sensing scheme which realizes parallel sensing of all the bit lines. Further, in order to prevent the current sensing type sense amplifier from being influenced by adjoining channels in the sense operation, a method is proposed in which a reading operation is performed for every other bit line at a time, while grounding the remaining bit lines that are not data reading target, thereby using the grounded bit lines as shield lines.

The current sensing type sense amplifier consumes more electricity than the voltage sensing type sense amplifier does because it executes sensing by causing a current to flow. Recently, as device miniaturization advances, the capacitance of the bit lines increases, leading to a problem that a large current is consumed when charging the bit lines. The voltage sensing type can limit the current when charging the bit lines by means of a current control circuit. However, if the current sensing type uses a power supply limited by a current control circuit in an operation of causing a current to flow through all the bit lines, the current flowing through the bit lines is not determined by the threshold of the memory cells, but is determined by the load of the current control circuit, which might result in erroneous data sense. Therefore, the current sensing type sense amplifier has to connect the power supply directly thereto without a current control circuit, thus allowing a large current to flow when charging the bit lines. Here, a nonvolatile semiconductor memory device is known which has a configuration for dispersing peak currents in a read operation by delaying the pre-charging operation of the bit lines by a certain time period among respective memory banks based on a control signal delayed by a delay circuit.

A data write operation of a NAND type flash memory is executed on a page basis by defining memory cells arranged along a selected word line as one page. Specifically, a write operation is executed as an operation of supplying a writing voltage to a selected word line and injecting electrons into a floating gate electrode from a cell channel under the effect of FN tunneling. In this case, the potential of the cell channel is controlled in accordance with whether the data to be written is "0" or "1".

That is, when writing data "0", a voltage VSS is supplied to a bit line and transferred to the channel of the selected memory cell via the select gate transistor which is electrically conductive. At this time, in the selected memory cell, a high electrical field is applied across the floating gate electrode and the channel, and hence electrons are injected into the floating gate electrode. In response to this, the threshold voltage distribution shifts toward the positive direction. On the other hand, when writing data "1" (non-write), a voltage VDD is supplied to a bit line to charge the cell channel up to a voltage VDD-Vth (Vth is the threshold voltage of the select gate transistor), and then the cell channel is brought into a floating state. At this time, the potential of the cell channel rises due to capacitance coupling with the word line, thus prohibiting electron injection into the floating gate electrode. Hence, the threshold voltage distribution does not shift.

As the capacity of the NAND type flash memory increases, the number of bit lines increases. Furthermore, the voltage VDD for charging the bit lines in a write operation is higher than the voltage for charging the bit lines in a read operation. Therefore, when charging the bit lines up to the voltage VDD in a write operation of the memory, there is a problem that the total of the currents flowing through all the bit lines becomes large.

BRIEF DESCRIPTION OF THE DRAWINGS

FIG. 6 is a diagram explaining the layout of circuits in a nonvolatile semiconductor memory device according to a comparative example.

FIG. 7 is a circuit diagram of a control circuit of the nonvolatile semiconductor memory device according to the comparative example.

FIG. 8A shows current and voltage waveforms for explaining a bit line charging operation of the nonvolatile semiconductor memory device according to the comparative example.

FIG. 9B shows current and voltage waveforms for explaining a bit line charging operation of the nonvolatile semiconductor memory device according to the first embodiment.

FIG. 12 shows current waveforms for explaining bit line charging operations of the nonvolatile semiconductor memory devices according to the first and second embodiments.

DETAILED DESCRIPTION

Figure 1:
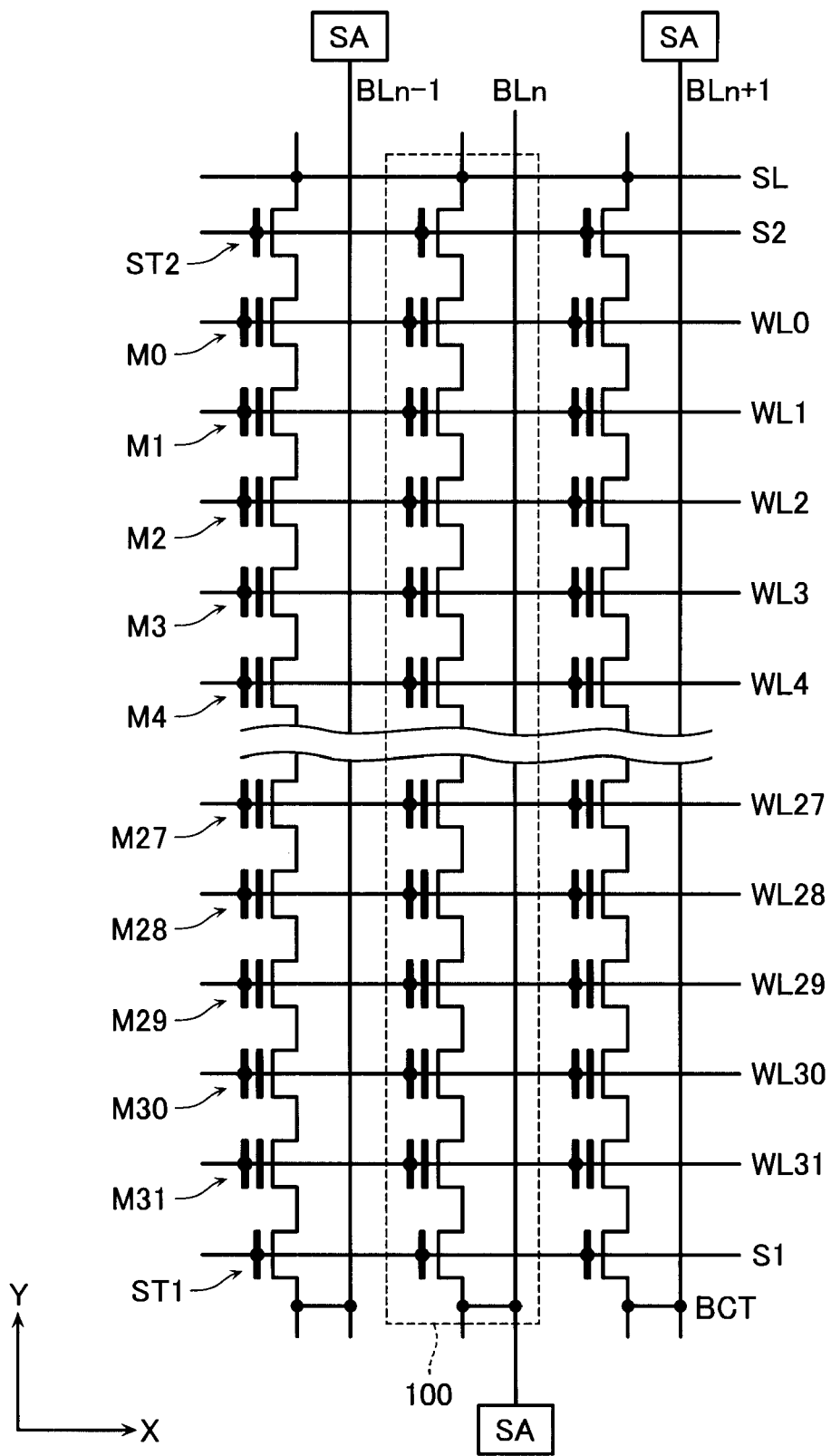
FIG. 1 is a diagram showing a memory cell array and sense amplifiers of a nonvolatile semiconductor memory device according to a first embodiment.

A nonvolatile semiconductor memory device according to one embodiment includes: a plurality of planes; a memory cell array provided in the plurality of planes respectively; word lines; bit lines; a source line; and a control circuit. Each memory cell array is configured as an array of NAND cell units each including: a memory string and select transistors connected to both ends of the memory string respectively. The memory string includes a plurality of nonvolatile memory cells connected in series. The word lines are connected to a control gate electrode of the nonvolatile memory cells, respectively. The bit lines are connected to a first end of the NAND cell units, respectively. The source line is connected to second ends of the NAND cell units. The control circuit controls a write operation of charging the bit lines up to a certain voltage value, and then setting data in the nonvolatile memory cells to a certain threshold voltage distribution state. The control circuit is configured to be capable of executing an operation of charging the bit lines in a write operation by varying timings of starting charging the bit lines among the plurality of planes.

Next, an embodiment of the present invention will be explained in detail with reference to the drawings. In the attached drawings of the embodiment, any portions having the same configuration are denoted by the same reference numerals and redundant explanation thereof will be omitted. In the following embodiments, explanation will be provided on the assumption that a nonvolatile semiconductor memory device is a NAND type flash memory that uses memory cells having a stacked gate structure. However, such a configuration is a mere example, and needless to say, the present invention is not limited to this.

First Embodiment

Configuration of Nonvolatile Semiconductor
Memory Device According to First Embodiment The configuration of a nonvolatile semiconductor memory device according to a first embodiment of the present invention will be explained with reference to FIG. 1 and FIG. 2.

FIG. 1 is a diagram showing a memory cell array and a sense amplifier of a NAND type flash memory according to the present embodiment. A NAND cell unit 100 of the NAND type flash memory includes a drain-side select gate transistor ST1, a source-side select gate transistor ST2, and a plurality of memory cells Mn (n=0 to 31) series-connected between the select gate transistors ST1 and ST2. In the NAND cell unit 100, the plurality of memory cells Mn share source and drain regions with adjoining memory cells, and thus form a memory string. The memory cell array is configured by arranging a plurality of NAND cell units 100 in a matrix formation.

The memory cell Mn has N-type source/drain regions that are formed in a P-type well of a silicon substrate, and has a stacked gate structure including a control gate electrode and a floating gate electrode as a charge accumulation layer. The NAND type flash memory changes the amount of charges stored in the floating gate electrode depending on whether the operation is a write operation or an erase operation. Hence, the threshold voltage of the memory cell Mn is changed and one-bit or multi-bit data is stored in one memory cell.

The control gate electrodes of a plurality of memory cells Mn arranged in the X direction of FIG. 1 are commonly connected by a word line WLn (n=0 to 31). The gate electrodes of a plurality of drain-side select gate transistors ST1 are commonly connected by a drain-side select gate line S1. The gate electrodes of a plurality of source-side select gate transistors ST2 are commonly connected by a source-side select gate line S2. In the NAND type flash memory, an aggregate of a plurality of NAND cell units 100 sharing word lines WLn configures a block.

A bit line contact BCT is connected to a drain region of the drain-side select gate transistor ST1. The bit line contact BCT is connected to the bit line BL extending in the Y direction of FIG. 1. The source-side select gate transistor ST2 is connected via its source region to a source line SL extending in the X direction of FIG. 1. A sense amplifier SA used for each of read, write, and erase operations of cell data is provided at an end of the bit line BL. Each bit line BL is provided with one sense amplifier SA. The sense amplifiers SA are provided alternately at one end (the upper end in FIG. 1) and the opposite end (the lower end in FIG. 1) of a plurality of bit lines BL. That is, the sense amplifiers SA are provided at the upper end in FIG. 1 of the bit line BLn−1, at the lower end in FIG. 1 of the bit line BLn, and at the upper end in FIG. 1 of the bit line BLn+1, respectively. Though not illustrated in FIG. 1, the word lines WL and the select gate lines S1 and S2 are provided at one end thereof with row decoders/drivers which select and drive the word lines WL and the select gate lines S1 and S2 respectively.

Figure 2:
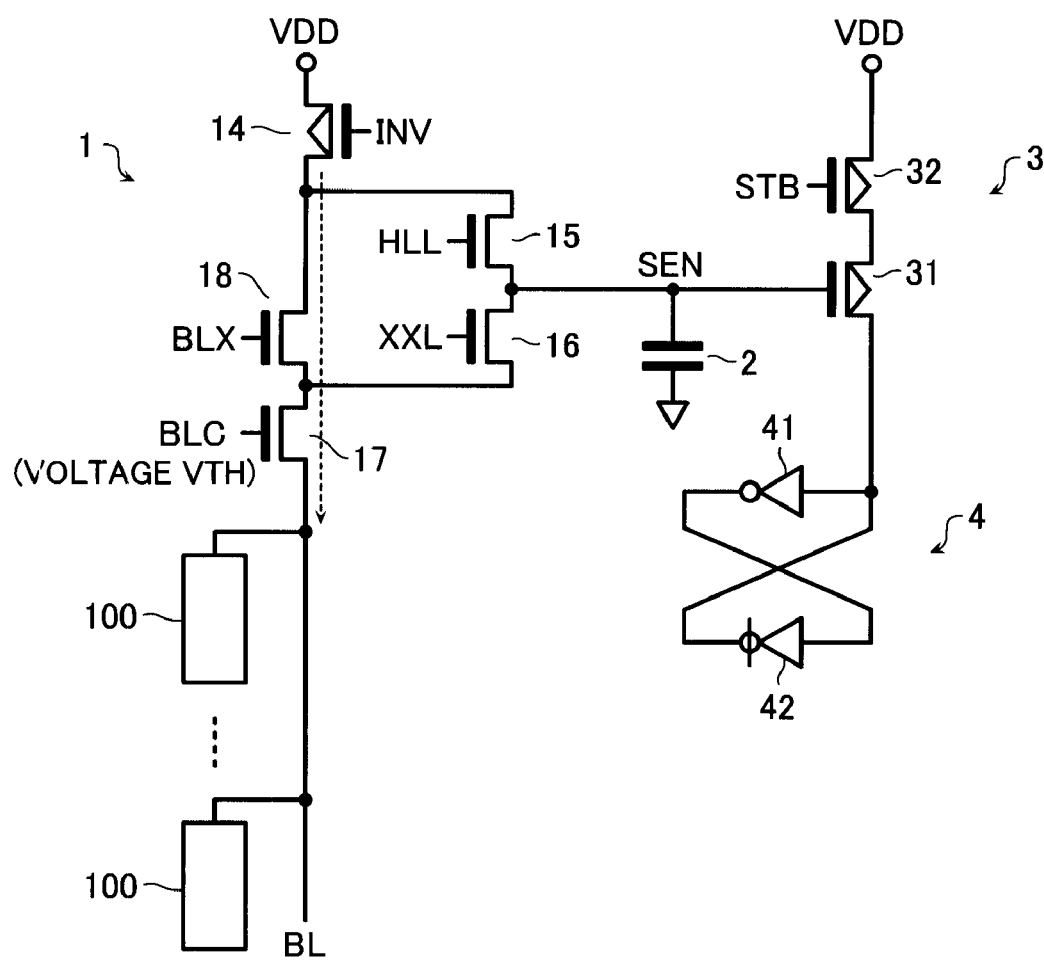
FIG. 2 is a circuit diagram of a sense amplifier of the nonvolatile semiconductor memory device according to the first embodiment.

FIG. 2 is a circuit diagram showing the sense amplifier SA according to the first embodiment of the present invention. This sense amplifier SA is an ABL type sense amplifier used as a reading circuit of, for example, a NAND type flash memory.

The bit line BL is connected to a plurality of NAND cell units 100. The sense amplifier SA mainly includes: a charging circuit 1 configured to charge the bit line BL and a sense node SEN; a sense capacitor 2 connected to the sense node SEN; a current discriminating circuit 3 configured to detect a value of a current flowing through the bit line BL based on the potential of the sense node SEN; and a latch 4 configured to retain an output of the current discriminating circuit 3 as read data.

The charging circuit 1 includes: a PMOS transistor 14 and an NMOS transistor 15 series-connected between a power supply VDD and the sense node SEN; an NMOS transistor 16 and a voltage clamp NMOS transistor 17 series-connected between the sense node SEN and the NAND cell unit 100; and an NMOS transistor 18 parallel-connected with a series circuit of the NMOS transistors 15 and 16. The NMOS transistors 15, 16, and 18 have a function of switching charge/discharge paths that extend between the bit line BL and the sense node SEN. The charging circuit 1 has a function of causing a current to continuously flow through the bit line BL during a read operation of the NAND type flash memory, and also a function of charging the bit line BL in a write operation.

The current discriminating circuit 3 includes a PMOS transistor 31 having a gate which is connected to the sense node SEN, and a PMOS transistor 32 connected between the source of the transistor 31 and the power supply VDD. The latch 4 configured by inverse-parallel-connected CMOS inverters 41 and 42 is connected to the drain of the PMOS transistor 31. The output of the latch 4 is connected to an unillustrated data bus. The transistor 31 becomes electrically conductive at a timing to cause the latch 4 to latch the data retained in a memory cell Mn.

Next, a write operation of the NAND type flash memory using the charging circuit 1 in the sense amplifier SA will be explained.

When writing data "0" in a memory cell Mn, a writing voltage Vpgm (e.g., 15V to 20V) is applied to the selected word line WL. Further, a voltage VSS is supplied to the bit line BL and transferred to the channel of the selected memory cell Mn via the drain-side select gate transistor ST1 which becomes electrically conductive. At this time, a high electrical field is applied across the floating gate electrode and cell channel of the selected memory cell Mn, causing electrons to be injected from the cell channel into the floating gate electrode under the effect of FN tunneling. When storing multi-value data, it is possible to provide a plurality of threshold voltage distributions by varying the number of times of applying writing pulses to adjust the amount of electrons to be injected into the floating gate.

When writing data "1" (non-write), a power supply voltage VDD is supplied from the above-described sense amplifier SA to the bit line BL. By this operation, the cell channel is charged up to a voltage VDD−Vth (Vth is the threshold voltage of the select gate transistor). After this, the cell channel is brought into a floating state. In this case, even if a writing voltage Vpgm is applied to the selected word line WL, no electrons are injected into the floating gate electrode because the potential of the cell channel rises due to capacitance coupling with the word lines WL. As a result, the memory cell Mn retains data "1".

In this write operation, for example, the charging circuit 1 in the sense amplifier SA charges the bit line BL from the power supply VDD via the PMOS transistor 14 and the NMOS transistor 18. At this time, a voltage VTH is applied to a bit line clamp voltage line BLC connected to the gate of the NMOS transistor 17. The voltage value of the voltage VTH is set to a value which makes it possible to transfer a voltage by which the bit line BL is charged up to the voltage VDD. For example, the voltage value of the voltage VTH is set to VTH=VDD+Vtn (the threshold of the NMOS transistor 17)+0.3V (a margin). By this voltage VTH, the bit line BL is charged up to the voltage VDD.

Figure 3A:
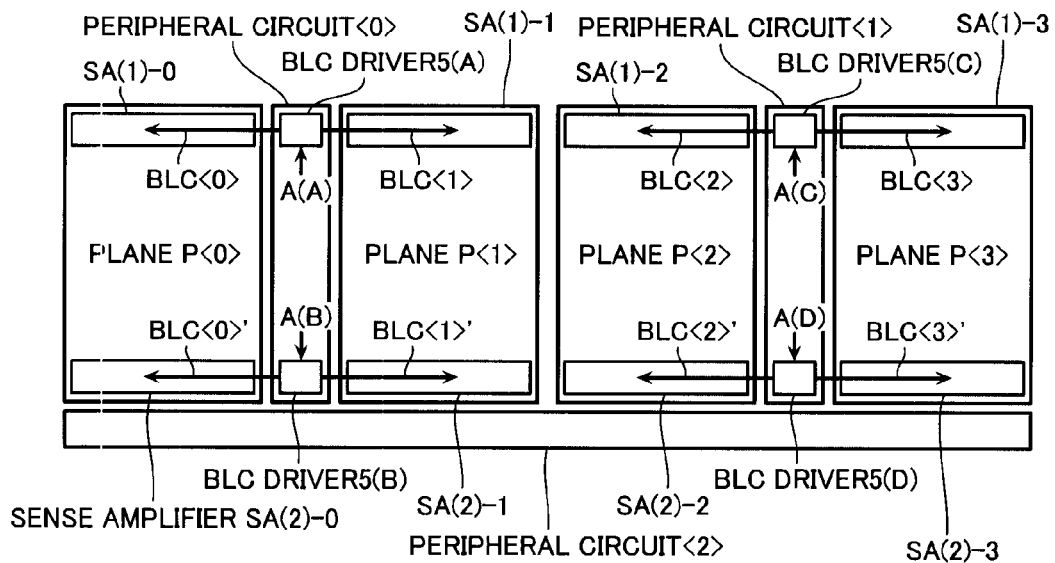
FIG. 3A is a diagram explaining the layout of circuits in the nonvolatile semiconductor memory device according to the first embodiment.
Figure 3B:
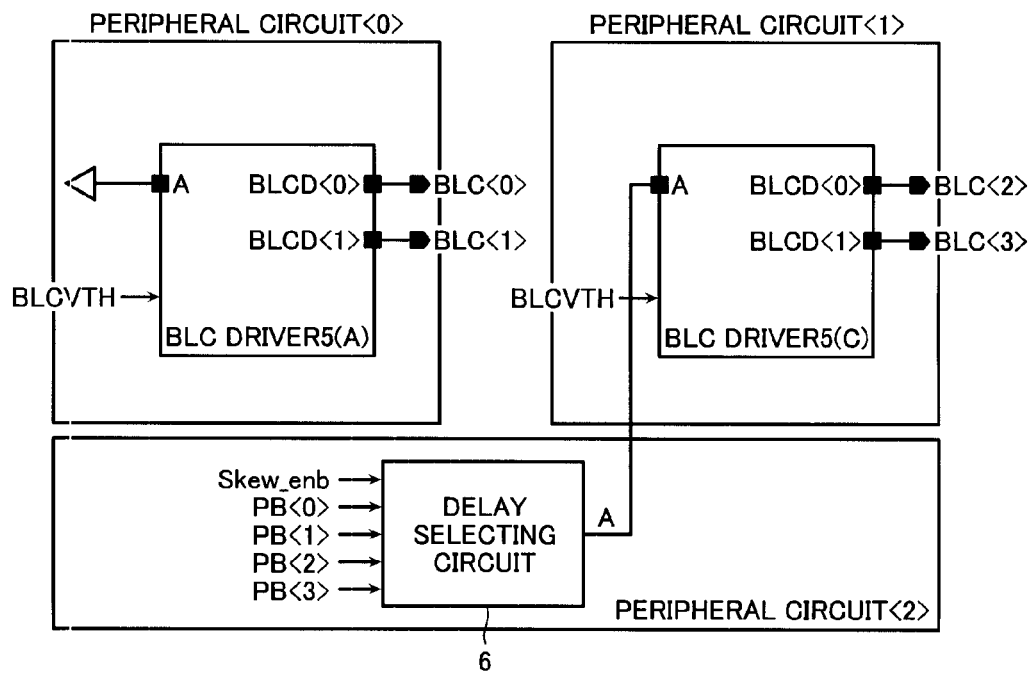
FIG. 3B is a diagram explaining the layout of circuits in the nonvolatile semiconductor memory device according to the first embodiment.

Next, the layout of a control circuit for applying the voltage VTH to the aforementioned bit line clamp voltage line BLC will be explained. FIG. 3A is a diagram explaining the layout of circuits in the NAND type flash memory according to the present embodiment. FIG. 3B is an enlarged diagram showing a part thereof.

In the NAND type flash memory according to the present embodiment, one memory chip is divided into a plurality of planes P in order to accelerate the operation speed. In the present embodiment, explanation will be provided based on an example that one memory chip is divided into four planes P<0> to P<3>. A memory cell array shown in FIG. 1 is provided in each of the planes P<0> to P<3>. Sense amplifiers SA(1) and SA(2) as shown in FIG. 2 are provided at one and the other ends of each of the planes P<0> to P<3>. In the following description, the sense amplifiers SA(1) and SA(2) at both ends of a plane P<i> (i=0 to 3) are sometimes denoted by SA(1)-i and SA(2)-i, respectively. Peripheral circuits <0> and <1> each including a control circuit used for read, write, and erase of data are provided between the plane P<0> and the plane P<1> and between the plane P<2> and the plane P<3> respectively.

The peripheral circuits <0> and <1> each include bit line clamp voltage line drivers (BLC driver) 5 configured to apply the voltage VTH to the bit line clamp voltage lines BLC. The bit line clamp voltage lines BLC (BLC<0>, BLC<0>', BLC<1>, BLC<1>') in the sense amplifiers SA(1) and SA(2) (SA(1)-0, SA(2)-0, SA(1)-1, SA(2)-1) in the planes P<0> and P<1> are provided with voltages by the bit line clamp voltage line drivers 5(A) and 5(B) in the peripheral circuit <0>. The bit line clamp voltage lines BLC (BLC<2>, BLC<2>', BLC<3>, BLC<3>') in the sense amplifiers SA(1) and SA(2) (SA(1)-2, SA(2)-2, SA(1)-3, SA(2)-3) in the planes P<2> and P<3> are provided with voltages by the bit line clamp voltage line drivers 5(C) and 5(D) in the peripheral circuit <1>. The bit line clamp voltage line drivers 5(A) and 5(C) are provided for the sense amplifiers SA(1), and the bit line clamp voltage line drivers 5(B) and 5(D) are provided for the sense amplifiers SA(2).

A peripheral circuit <2> used for various operations of the NAND type flash memory is provided to adjoin the planes P<0> to P<3> and the peripheral circuits <0> and <1> at the side of the sense amplifiers SA(2).

The NAND type flash memory according to the present embodiment can execute write operations in all of the planes P<0> to P<3> simultaneously. However, in this case, it is feared that the peak current might rise because the charging currents flow through all the bit lines BL simultaneously. The NAND type flash memory according to the present embodiment executes an operation of varying the timings of charging the bit lines BL among the planes P when charging the bit lines BL.

The operation of varying the timings of charging the bit lines EL is executed by controlling on a plane basis the timing of applying the voltage VTH to the bit line clamp voltage lines BLC in the sense amplifiers SA. The bit line clamp voltage line drivers 5(A) and 5(B) charge the bit lines BL by varying the timings of applying the voltage VTH between the plane P<0> and the plane P<1>. The bit line clamp voltage line drivers 5(C) and 5(D) charge the bit lines BL by varying the timings of applying the voltage VTH between the plane P<2> and the plane P<3>. It is possible to vary the timings of charging the bit lines BL among all the planes plane P<0> to P<3> by the bit line clamp voltage line drivers 5(A) and 5(B) and the bit line clamp voltage line drivers 5(C) and 5(D) varying the timings of applying the voltage VTH.

A connection state between the bit line clamp voltage line driver 5 and a delay selecting circuit 6 of the NAND type flash memory according to the present embodiment will be explained. The delay selecting circuit 6 is a circuit used for controlling the bit line clamp voltage line driver 5. FIG. 3B shows the bit line clamp voltage line drivers 5(A) and 5(C) and the delay selecting circuit 6 provided in the peripheral circuits <0>, <1>, and <2> respectively.

As shown also in FIG. 3A, the bit line clamp voltage line driver 5(A) is provided in the peripheral circuit <0>. The bit line clamp voltage line driver 5(C) is provided in the peripheral circuit <1>. Note that only one delay selecting circuit 6 is provided in the peripheral circuit <2>.

A terminal A (described later) of the bit line clamp voltage line driver 5(A) is grounded. A signal BLCVTH for starting applying the voltage VTH to the bit line clamp voltage line BLC is input to the bit line clamp voltage line driver 5(A). Drive lines BLCD<0> and BLCD<1> of the bit line clamp voltage line driver 5(A) are connected to the bit line clamp voltage lines BLC<0> and BLC<1> in the sense amplifiers SA(1)-0 and SA(1)-1 of the planes P<0> and P<1> respectively.

A terminal A of the bit line clamp voltage line driver 5(C) is connected to the delay selecting circuit 6. The signal BLCVTH for starting applying the voltage VTH to the bit line clamp voltage line BLC is also input to the bit line clamp voltage line driver 5(C). Drive lines BLCD<0> and BLCD<1> of the bit line camp voltage line driver 5(C) are connected to the bit line clamp voltage lines BLC<2> and BLC<3> in the sense amplifiers SA(1)-2 and SA(1)-3 of the planes P<2> and P<3> respectively.

The bit line clamp voltage line drivers 5(B) and 5(D) are omitted in FIG. 3B. However, these drivers are provided in the peripheral circuits <0> and <1> in a similar connection state to that of the bit line clamp voltage line drivers 5(A) and 5(C). That is, a terminal A of the bit line clamp voltage line driver 5(B) is grounded, and drive lines BLCD<0> and BLCD<1> thereof are connected to the bit line clamp voltage lines BLC<0>' and BLC<1>' respectively. A terminal A of the bit line clamp voltage line driver 5(D) is connected to the delay selecting circuit 6, and drive lines BLCD<0> and BLCD<1> thereof are connected to the bit line clamp voltage lines BLC<2>' and BLC<3>' respectively.

A signal Skew_enb and signals PB<0> to PB<3> are input to the delay selecting circuit 6. The signal Skew_enb is a signal for controlling whether or not to execute the operation of varying the timings of charging the bit lines BL among the planes P. When the signal Skew_enb is "H", the operation of varying the timings of charging the bit lines BL among the planes P is executed. The signals PB<0> to PB<3> are signals indicative of selection of any plane P. When selecting the plane P<i>, the signal PB<i> becomes "H". The delay selecting circuit 6 outputs a signal A based on the signal Skew_enb and the signals PB<0> to PB<3>.

Next, specific configurations of the bit line clamp voltage line driver 5 and the delay selecting circuit 6 for controlling the timings of applying the voltage VTH to the bit line clamp voltage lines BLC will be explained.

Figure 4:
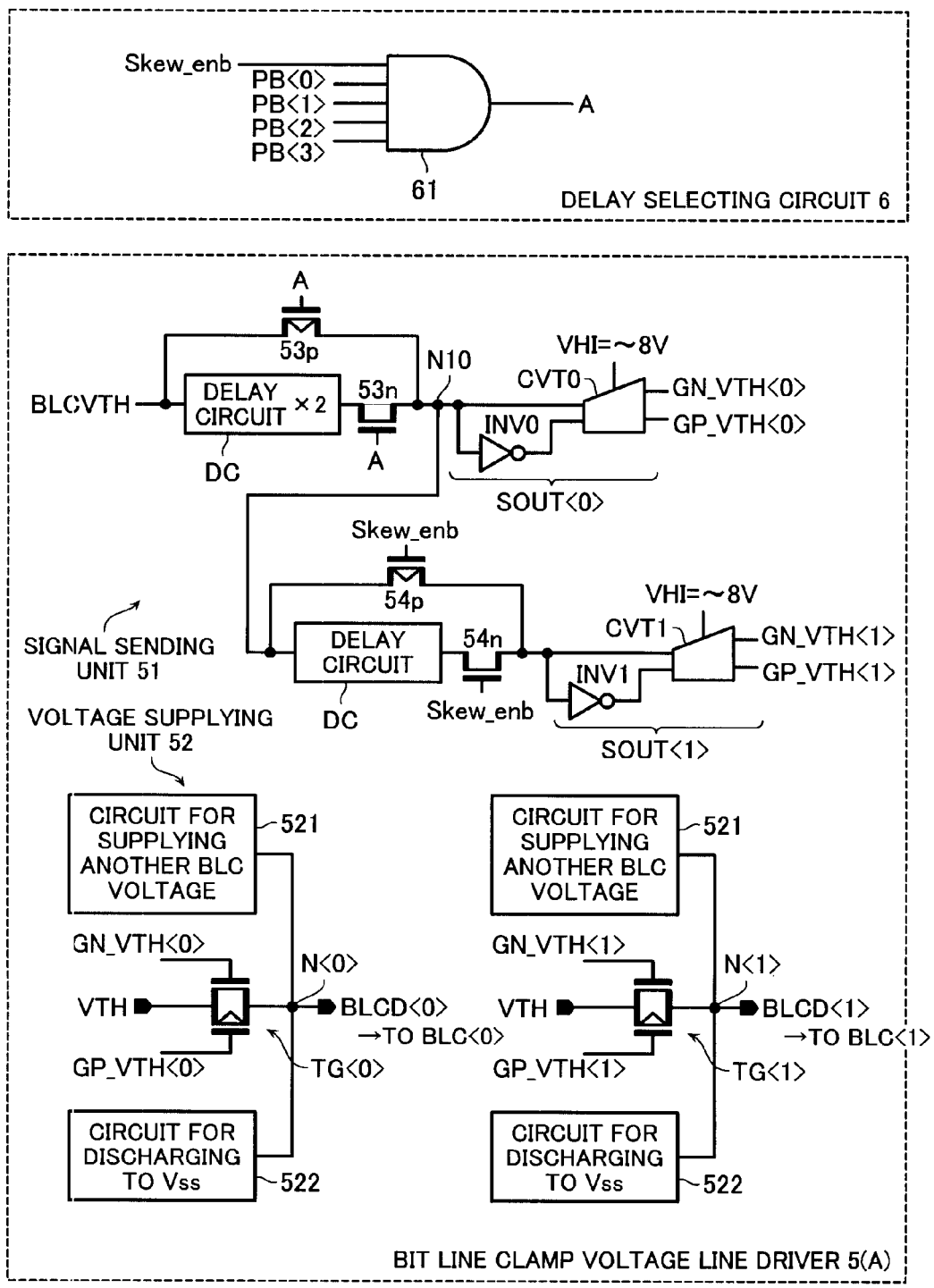
FIG. 4 is a circuit diagram of a control circuit of the nonvolatile semiconductor memory device according to the first embodiment.

FIG. 4 is a circuit diagram of the bit line clamp voltage line driver 5(A) of the NAND type flash memory according to the present embodiment. The bit line clamp voltage line drivers 5(A) to 5(D) shown in FIG. 3A have substantially the same configuration. The connection relationship of the bit line clamp voltage line drivers 5(B) and 5(D) is similar to the connection relationship of the bit line clamp voltage line drivers 5(A) and 5(C) shown in FIG. 3B. Therefore, the following explanation will be provided by employing the configuration of the bit line clamp voltage line driver 5(A) as an example, and explanation of the bit line clamp voltage line drivers 5(B) to 5(D) will not be provided. FIG. 4 also shows a circuit diagram of the delay selecting circuit 6 used for controlling the bit line clamp voltage line driver 5(A).

First, the delay selecting circuit 6 will be explained. The delay selecting circuit 6 is configured by a logic gate 61. The signal Skew_enb and the signals PB<0> to PB<3> are input to the logic gate 61. The logic gate 61 calculates a logical AND of these input signals to control the output signal A. The output signal A becomes "H" when the signal Skew_enb is "H" and the signals PB<0> to PB<3> are all "H". When the signal A is "H", an operation of charging the bit lines BL is executed in all of the planes P by varying the timings of starting charging the bit: lines BL among the planes P.

The bit line clamp voltage line driver 5 includes: a signal sending unit 51 configured to delay a signal for starting applying the voltage VTH when applying the voltage VTH to the bit line clamp voltage line BLC by a certain time period between the planes P<0> and P<1>; and a voltage supplying unit 52 configured to apply the voltage to the drive line BLCD connected to the bit line clamp voltage line BLC based on the signal for starting applying the voltage.

The signal BLCVTH for starting applying the voltage VTH to the bit line clamp voltage line BLC is input to the signal sending unit 51. The signal BLCVTH is output to a node N10 via either a switch PMOS transistor 53p or a switch NMOS transistor 53n. The path to the node N10 via the switch transistor 53n is provided with two delay circuits DC which are series-connected. The delay circuits DC output the signal BLCVTH by delaying it by a certain time period. The switch transistors 53p and 53n are controlled by a signal input to their gate terminals A as to whether to become electrically conductive or not. When the signal input to the terminals A is "H", the switch transistor 53n becomes electrically conductive. When the signal is "L", the switch transistor 53p becomes electrically conductive. As shown in FIG. 3B, the terminal A of the bit line clamp voltage line driver 5(A) is grounded, while the output signal A of the delay selecting circuit 6 is input to the terminal A of the bit line clamp voltage line driver 5(C). The signal BLCVTH output to the node N10 is input to a signal output unit SOUT<0>. The signal output unit SOUT<0> is configured by an inverter INV0 and a signal circuit CVT0 connected to a power supply VHI. The signal output unit SOUT<0> outputs complementary signals GN_VTH<0> and GP_VTH<0> based on the signal BLCVTH and its inverse signal /BLCVTH.

The signal BLCVTH output to the node N10 is also input to a signal output unit SOUT<1> via either a switch PMOS transistor 54p or a switch NMOS transistor 54n. The path to the signal output unit SOUT<1> via the switch transistor 54n is provided with one delay circuit DC. The signal Skew_enb is input to the gates of the switch transistors 54p and 54n. When the signal Skew_enb is "H", the switch transistor 54n becomes electrically conductive. When the signal Skew_enb is "L", the switch transistor 54p becomes electrically conductive. The signal output unit SOUT<1> is configured by an inverter INV1 and a signal circuit CVT1 connected to a power supply VHI. The signal output unit SOUT<1> outputs complementary signals GN_VTH<1> and GP_VTH<1> based on the signal BLCVTH input thereto via either the switch transistor 54p or 54n and its inverse signal /BLCVTH.

The voltage supplying unit 52 includes: the drive lines BLCD<0> and BLCD<1> connected to the bit line clamp voltage lines BLC; and power supplies VTH for supplying a voltage to the drive lines BLCD<0> and BLCD<1>. The drive lines BLCD<0> and BLCD<1> are connected to the power supplies VTH via transfer gates TG<0> and TG<1> respectively. The transfer gates TG<0> and TG<1> are each configured by an NMOS transistor and a PMOS transistor which are parallel-connected. The aforementioned complementary signals GN_VTH<0> and GP_VTH<0> are input to the gates of the NMOS transistor and PMOS transistor of the transfer gate TG<0>. The complementary signals GN_VTH<1> and GP_VTH<1> are input to the gates of the NMOS transistor and PMOS transistor of the transfer gate TG<1>. The transfer gates TG<0> and TG<1> are controlled as to whether to become electrically conductive or not based on these signals.

The voltage supplying unit 52 applies the voltage VTH to the drive lines BLCD<0> and BLCD<1> when the transfer gates TG<0> and TG<1> become electrically conductive in response to the complementary signals GN_VTH<0> and GP_VTH<0> and the complementary signals GN_VTH<1> and GP_VTH<1>. The voltages of the drive lines BLCD<0> and BLCD<1> are applied to the bit line clamp voltage lines BLC.

Nodes N<0> and N<1> between the transfer gates TG<0> and TG<1> and the drive lines BLCD<0> and BLCD<1> may be connected to other circuits for controlling the voltages of the drive lines BLCD<0> and BLCD<1>. For example, voltage supplying circuits 521 used for setting the voltages of the drive lines BLCD<0> and BLCD<1> to a voltage other than the voltage VTH (e.g., a voltage to be applied to the drive lines BLCD<0> and BLCD<1> in a read operation), and circuits 522 for discharging the nodes N<0> and N<1> to the ground voltage Vss may be connected.

[Operation of Nonvolatile Semiconductor Memory Device According to First Embodiment]

Figure 5A:
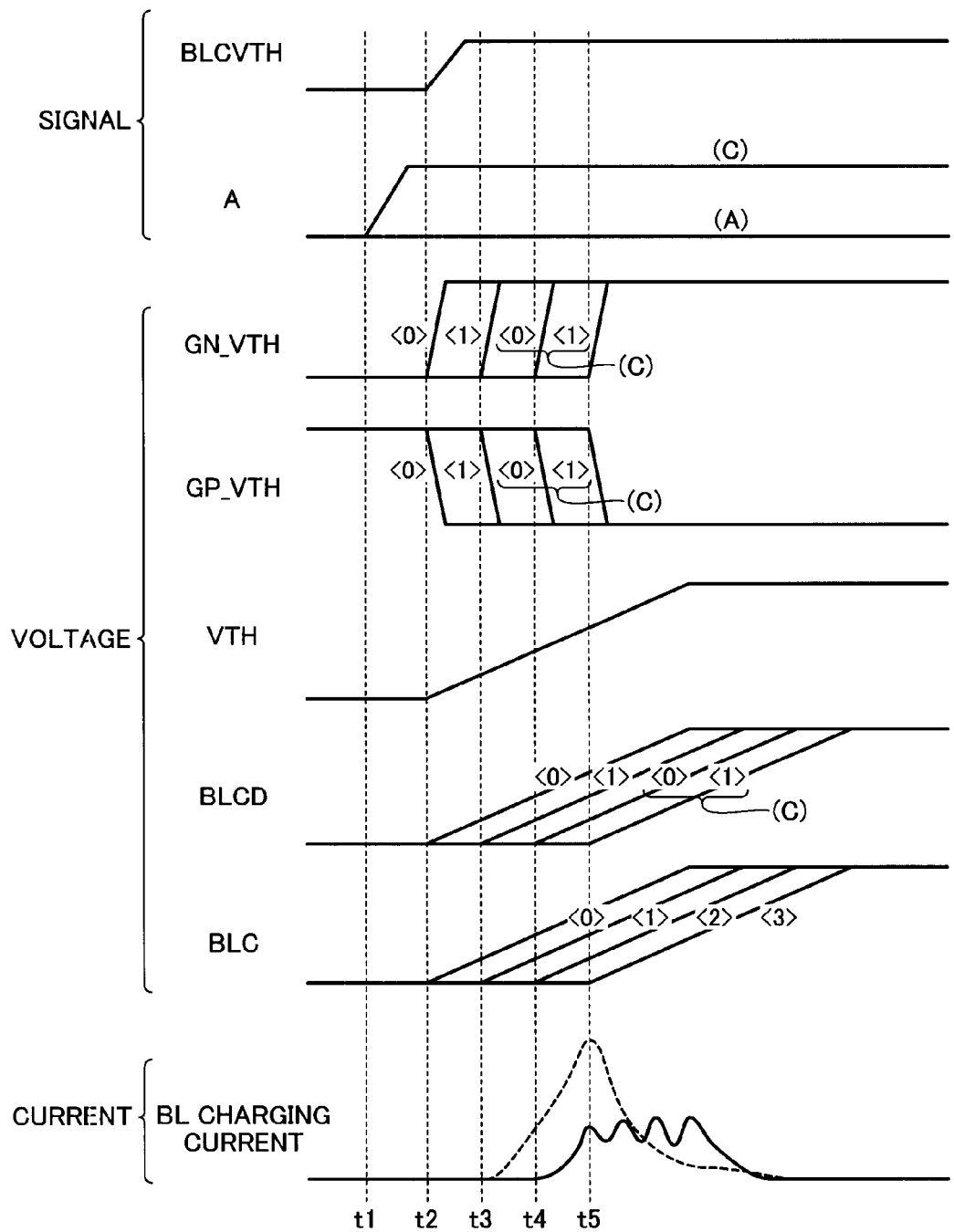
FIG. 5A shows current and voltage waveforms for explaining a bit line charging operation of the nonvolatile semiconductor memory device according to the first embodiment.

The NAND type flash memory according to the present embodiment executes the operation of charging the bit lines by using the control circuit having the above configuration. Next, the bit line charging operation of the NAND type flash memory will be explained with reference to FIG. 3B, FIG. 4, FIG. 5A and FIG. 5B. FIG. 5A shows current and voltage waveforms for explaining the bit line charging operation of the NAND type flash memory according to the present embodiment.

As described above, the bit line charging operation for a write operation of the NAND type flash memory according to the present embodiment is executed by varying the timings of charging the bit lines BL among the planes P although while executing the write operation on the plurality of planes P simultaneously. Here, the bit line charging operation of the NAND type flash memory will be explained by employing the operations of the bit line clamp voltage line drivers 5(A) and 5(C) shown in FIG. 3B as an example. However, the bit line clamp voltage line drivers 5(B) and 5(D) also execute the same operations as the bit line clamp voltage line drivers 5(A) and 5(C) respectively. The operations of the bit line clamp voltage line drivers 5(A) and 5(C) will be explained below, and explanation of the operations of the bit line clamp voltage line drivers 5(B) and 5(D) will not be provided.

In the bit line charging operation of the NAND type flash memory, the signal Skew_enb to be input to the delay selecting circuit 6 shown in FIG. 4 is set to "H" in order to execute the operation of varying the timings of charging the bit lines BL among the planes P. Here, if it is assumed that a write operation is executed simultaneously by selecting all the planes P<0> to P<3>, also the signals PB<0> to PB<3> are all set to "H". As a result, the delay selecting circuit 6 outputs the signal A as an "H" signal. At a timing t1 shown in FIG. 5A, the signal A(C) input to the terminal A of the bit line clamp voltage line driver 5(C) changes to "H". On the other hand, the signal A(A) input to the gates of the switch transistors 53p and 53n of the bit line clamp voltage line driver 5(A) is constantly "L" (a grounded state) because the terminal A of the driver 5(A) is grounded as shown in FIG. 3B. Therefore, the signal A(A) will not change from the timing t1 of FIG. 5A.

Next, at a timing t2, the signal BLCVTH input to the bit line clamp voltage line drivers 5(A) and 5(C) for starting applying the voltage VTH to the bit line clamp voltage lines BLC is turned to "H". Together with this, at the timing t2, the power supplies VTH of the bit line clamp voltage line drivers 5(A) and 5(C) are started to rise. The rising steepness of the power supplies VTH is determined by the value of a signal DAC input to the drivers of the power supplies VTH. The configuration and operation of the drivers of the power supplies VTH will be described in detail in a later embodiment.

In the bit line clamp voltage line driver 5(A), the signal A(A) is "L". Hence, the states of the signals GN_VTH<0> and GP_VTH<0> are changed without a delay via the switch transistor 53p shown in FIG. 4 (at the timing t2 of FIG. 5A). In the bit line clamp voltage line driver 5(A), the transfer gate TG<0> becomes electrically conductive in response to the signals GN_VTH<0> and GP_VTH<0>, thus applying the voltage VTH to the drive Line BLCD<0>.

Further, in the bit line clamp voltage line driver 5(A), the signal Skew_enb is "H". Hence, the states of the signals GN_VTH<1> and GP_VTH<1> are changed via the transistor 54n shown in FIG. 4 with a delay corresponding to one delay circuit DC (at a timing t3 of FIG. 5A). After the delay period corresponding to one delay circuit DC has passed, in the bit line clamp voltage line driver 5(A), the transfer gate TG<1> becomes electrically conductive in response to the signals GN_VTH<1> and GP_VTH<1>, thus applying the voltage VTH to the drive line BLCD<1>.

In the bit line clamp voltage line driver 5(C), the signal A(C) is "H". Hence, the states of the signals GN_VTH<0> and GP_VTH<0> are changed via the switch transistor 53n with a delay corresponding to two delay circuits DC (at a timing t4 of FIG. 5A). After the delay period corresponding to two delay circuits DC has passed, in the bit line clamp voltage line driver 5(C), the transfer gate TG<0> becomes electrically conductive in response to the signals GN_VTH<0> and GP_VTH<0>, thus applying the voltage VTH to the drive line BLCD<0>.

Further, in the bit line clamp voltage line driver 5(C), the signal Skew_enb is "H". Hence, the states of the signals GN_VTH<1> and GP_VTH<1> are changed via the switch transistors 53n and 54n with a delay corresponding to three delay circuits DC (at a timing t5 of FIG. 5A). After the delay period corresponding to three delay circuits DC has passed, in the bit line clamp voltage line driver 5(C), the transfer gate TG<1> becomes electrically conductive in response to the signals GN_VTH<1> and GP_VTH<1>, thus applying the voltage VTH to the drive line BLCD<1>.

The voltage VTH is applied to the bit line clamp voltage lines BLC of the respective planes P<0> to P<3> through the drive lines BLCD<0> and BLCD<1> of the bit line clamp voltage line drivers 5(A) and 5(C). As a result of the above-described operations of the bit line clamp voltage line drivers 5(A) and 5(C), the voltage VTH is applied sequentially to the bit line clamp voltage lines BLC<0>, BLC<1>, BLC<2>, and BLC<3> in this order.

Figure 5B:
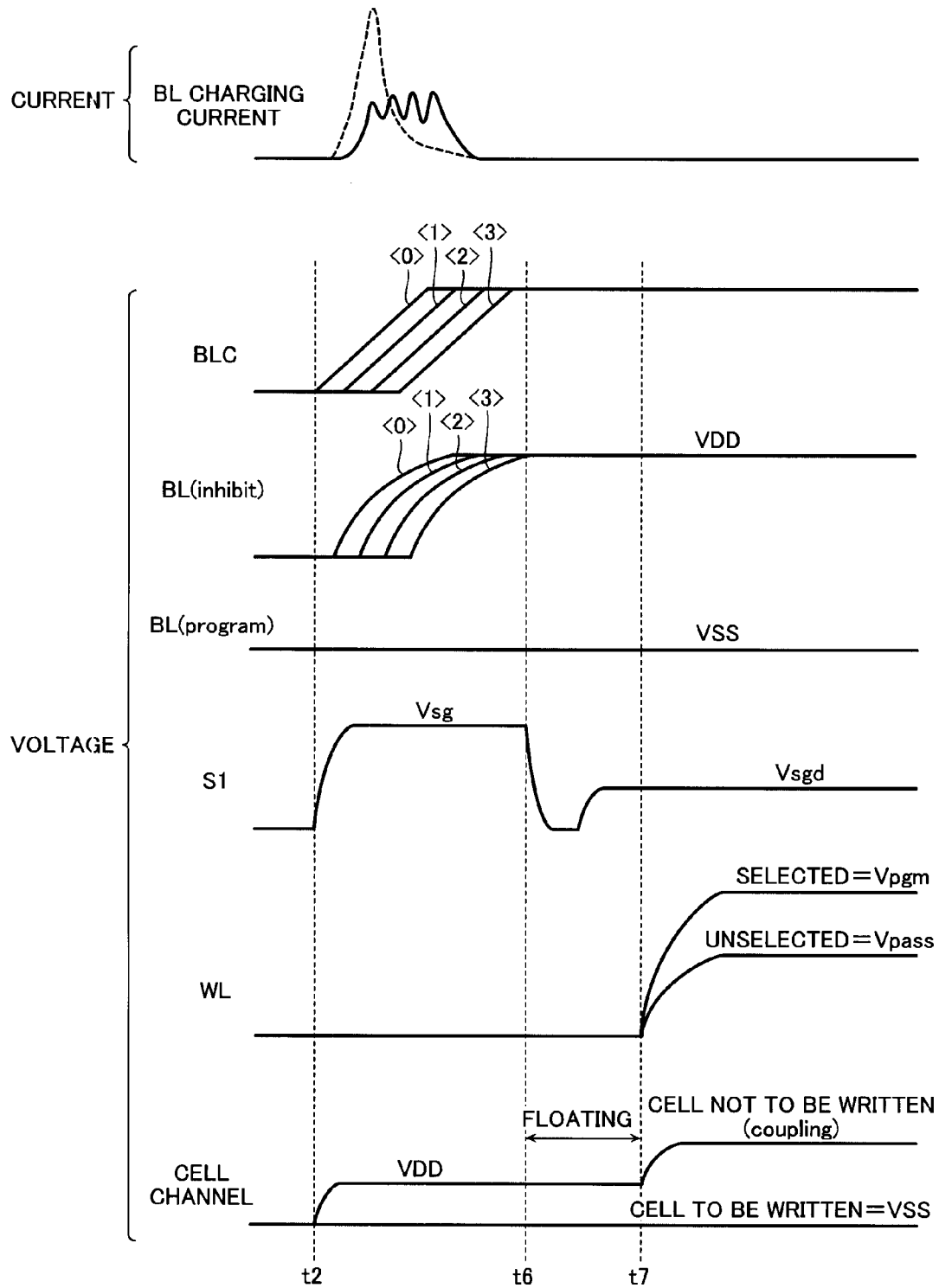
FIG. 5B shows current and voltage waveforms for explaining a write operation of the nonvolatile semiconductor memory device according to the first embodiment.

A data write operation of the NAND type flash memory is executed by using the bit lines thusly charged. A data write operation of the NAND type flash memory is executed on a page basis, by defining memory cells arranged along a selected word line WL as one page. A specific write operation will now be explained with reference to a timing chart shown in FIG. 5B. The timing chart shown in FIG. 5B corresponds to the timing chart shown in FIG. 5A. That is, the timing t2 of FIG. 5A is the same timing as the timing t2 of FIG. 5B, and the bit line charging current and the voltage of the bit line clamp voltage line BLC are the same as explained in relation to FIG. 5A. FIG. 5B shows voltage waveforms for explaining the operation after the bit line charging operation.

A data write operation of the NAND type flash memory is executed as an operation of supplying a writing voltage Vpgm to a selected word line WL to inject electrons into the floating gate electrode from the cell channel under the effect of FN tunneling. In this case, the potential of the cell channel is controlled depending on whether the data to be written is "0" or "1".

First, write of data "0" will be explained. When writing data "0", the voltage VSS is supplied to a selected bit line BL (program) through the discharge path provided in the sense amplifier SA. At the timing t2, a voltage Vsg is applied to the gate S1 of the select gate transistor ST1 to transfer the voltage VSS to the cell channel. Therefore, the cell channel of the memory cell to be written is maintained at the voltage VSS.

After this, when the writing voltage Vpgm (about 18V) is applied to the selected word line at a timing t7 with the channel maintained at the voltage VSS, a high electrical field is applied across the floating gate electrode and the channel (voltage VSS) in the selected memory cell, causing electrons to be injected into the floating gate electrode. Therefore, the threshold voltage distribution of the memory cell shifts toward the positive direction. At this time, unselected memory cells are not written because a voltage Vpass (about 10V) lower than the writing voltage is applied to the unselected word lines WL.

On the other hand, when writing data "1" (non-write), the voltage VDD is applied to unselected bit lines BL (inhibit) from the timing t2. Here, the bit line clamp voltage lines BLC rise at different timings in different planes P<0> to P<3> respectively, as explained by using FIG. 5A. Therefore, the unselected bit lines BL (inhibit) are charged at different timings in different planes P<0> to P<3> up to the voltage VDD. After this, the voltage VDD is transferred via the gates S1 of the select gate transistors ST1. Therefore, the cell channels of the memory cells to be written are charged up to a voltage VDD-Vth (Vth is the threshold voltage of the select gate transistor ST1).

After this, at a timing t6, the select gate transistors ST1 are turned to a non-conductive state to bring the cell channels into a floating state. Subsequently, at a timing t7, a voltage Vsgd lower than the voltage VDD is applied to the gates S1 of the select gate transistors ST1. Then, when the writing voltage Vpgm (about 18V) is applied to the selected word line at the timing t7, the potential of the cell channels rises due to capacitance coupling with the word line, thus prohibiting electron injection into the floating gate electrodes. Hence, the threshold voltage distribution does not shift.

Here, the voltage applied to the gate S1 of the select gate transistor ST1 at the timing t2 is Vsg, as an example. However, a potential (e.g., about 4V) higher than a voltage VDD+Vth may be supplied to transfer the voltage VDD to the cell channel.

As the capacity of the NAND type flash memory increases, the number of bit lines increases. The voltage VDD for charging the bit lines in a write operation (e.g., 2.5V) is higher than the voltage for charging the bit lines in a read operation (e.g., 0.5V). Therefore, there is a problem that when charging the bit lines up to the voltage VDD in a write operation of the memory, the total of the currents flowing through all the bit lines becomes large. Furthermore, with the recent increase in the capacity per one NAND type flash memory chip, one chip often includes a plurality of planes (e.g., four planes). Hence, it is feared that the currents flowing through the bit lines might further increase.

In the bit line charging operation according to the present embodiment, the timings at which the bit line clamp voltage lines BLC<0>, BLC<1>, BLC<2>, and BLC<3> rise are different in different planes 2<0> to 2<3> respectively. Hence, currents flow through the bit lines BL at different timings, and the total current amount indicated by the solid line in the bit line charging current waveform shown in FIG. 5A and FIG. 5B does not become excessively large. The broken line in the current waveform indicates the current amount in a comparative example to be described below.

[Effect of Nonvolatile Semiconductor Memory Device according to First Embodiment]

An effect of the bit line charging operation of the NAND type flash memory according to the present embodiment will be explained by using a comparative example. FIG. 6 and FIG. 7 are diagrams explaining the comparative example. FIG. 6 is a diagram explaining the layout of circuits in a NAND type flash memory according to the comparative example. FIG. 7 is a circuit diagram of a bit line clamp voltage line driver 5 of the NAND type flash memory according to the comparative example.

As shown in FIG. 6, the NAND type flash memory according to the comparative example has a similar layout of the memory cell array and peripheral circuits to the NAND type flash memory according to the embodiment. The NAND type flash memory according to the comparative example is different from the NAND type flash memory according to the embodiment in the configuration of the bit line clamp voltage line drivers 5 provided in the peripheral circuits <0> and <1>.

As shown in FIG. 7, the bit line clamp voltage line driver 5 of the NAND type flash memory according to the comparative example includes: a signal sending unit 51 configured to output a signal BLCVTH for starting applying a voltage VTH when applying the voltage VTH to the bit line clamp voltage lines BLC; and a voltage supplying unit 52 configured to apply the voltage to the drive lines BLCD connected to the bit line clamp voltage lines BLC based on the signal BLCVTH.

The signal sending unit 51 according to the comparative example includes no delay circuit DC, and is configured by one signal output unit SOUT. The signal output unit SOUT outputs complementary signals GN_VTH and GP_VTH based on the signal BLCVTH for starting applying the voltage VTH to the bit line clamp voltage lines BLC and its inverse signal /BLCVTH.

In the voltage supplying unit 52 according to the comparative example, the complementary signals GN_VTH and GP_VTH output by the signal output unit SOUT are sent to all the transfer gates TG<0> and TG<1> included therein. The bit line clamp voltage line driver 5 according to the comparative example applies the voltage VTH to the drive lines BLCD<0> and BLCD<1> simultaneously based on the complementary signals GN_VTH and GP_VTH. This voltage VTH is applied to the bit line clamp voltage lines BLC in the sense amplifiers SA of the respective planes P<0> to P<3>.

Figure 8B:
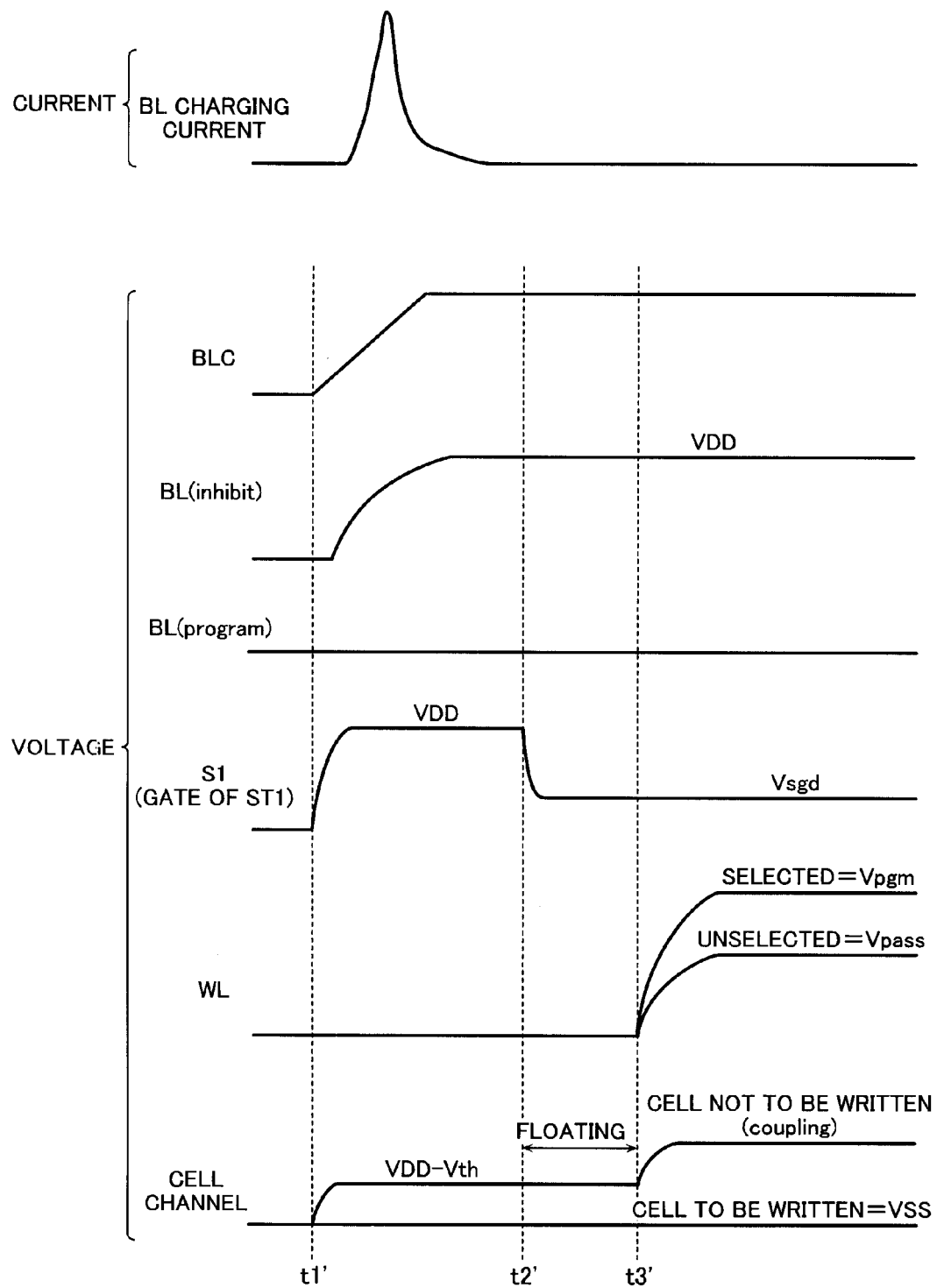
FIG. 8B shows current and voltage waveforms for explaining a write operation of the nonvolatile semiconductor memory device according to the comparative example.

Next, an operation of the NAND type flash memory according to the comparative example will be explained with reference to FIG. 8A and FIG. 8B. FIG. 8A shows current and voltage waveforms for explaining a bit line charging operation of the NAND type flash memory according to the comparative example.

As shown in FIG. 8A, at a timing t1', the signal BLCVTH for starting applying the voltage VTH to the bit line clamp voltage lines BLC is turned to "H" in the bit line clamp voltage line drivers 5(A) and 5(C). Hence, the states of the signals GN_VTH and GP_VTH change via the signal output unit SOUT in the bit line clamp voltage line drivers 5(A) and 5(C). Also at the timing t1', power supplies VTH are started to rise. As described above, the rising steepness of this voltage is determined by the value of a signal DAC input to the drivers of the power supplies VTH.

The bit line clamp voltage line drivers 5(A) and 5(C) apply the voltage VTH to the drive lines BLCD<0> and BLCD<1> based on the signals GN_VTH and GP_VTH. Since the signal sending unit 51 of the NAND type flash memory according to the comparative example includes no delay circuit DC, the voltage VTH is applied to the bit line clamp voltage lines BLC<0> to BLC<3> of the respective planes P<0> to P<3> simultaneously. That is, the bit lines BL of the planes P<0> to P<3> are charged simultaneously.

A data write operation of the NAND type flash memory is executed by using the bit lines BL thusly charged. FIG. 8B shows voltage waveforms for explaining an operation after the bit line charging operation. The timing chart shown in FIG. 8B is the same as that explained in FIG. 5B except that the bit line charging operation is executed in the plurality of planes simultaneously. The data write operation according to the comparative example shown in FIG. 8B is executed by bringing the cell channels into a floating state at a timing t2' and applying a certain voltage to the word line at a timing t3', substantially like the above-described embodiment.

In the bit line charging operation according to the comparative example shown in FIG. 8A, the voltage is applied to the bit line clamp voltage lines BLC<0> to BLC<3> of all the planes P<0> to P<3> simultaneously. Therefore, currents flow through the bit lines BL at the same timing, and the current amount becomes excessively large (see the current waveform of FIG. 8A).

As compared with this, in the bit line charging operation according to the first embodiment shown in FIG. 5A, the timings at which the bit line clamp voltage lines BLC<0>, BLC<1>, BLC<2>, and BLC<3> rise are varied among the planes P<0> to P<3>. As indicated by the current waveform of FIG. 5A, the maximum value of the current amount of the currents flowing through the bit lines BL in the charging operation according to the present embodiment is smaller than that of the currents flowing through the bit lines BL in the charging operation according to the comparative example indicated by the broken line. Therefore, even if the number of bit lines in the NAND type flash memory increases, it is possible to prevent the currents to flow when charging the bit lines BL in a write operation from becoming excessively large.

[Another Example of Nonvolatile Semiconductor Memory Device According to First Embodiment]

It is desired that the operation shown in FIG. 5B to be executed after the bit lines BL are charged be executed simultaneously in all the planes P<0> to P<3>. Therefore, setting the gates S1 of the select gate transistors ST1 to the voltage Vsgd has to be executed after charging the bit lines BL is completed in all the planes P<0> to P<3>. That is, if the timings of starting charging the bit lines are greatly varied in order to reduce the peak current, the bit line charging time becomes long. Because the write time of the NAND type flash memory greatly contributes to its performance, it is important to adjust the timings of starting charging the bit lines BL by taking into account a trade-off between the peak current value and the write time. According to the present embodiment, it is possible to provide a configuration for enabling to adjust the speed of charging the bit lines BL and the width of varying the timings of starting charging.

For example, the NAND type flash memory according to the present embodiment can allow for accelerating the rise of the power supplies VTH when the maximum value of the currents to flow when charging the bit lines BL is tolerated to reach a value around the maximum value of the comparative example.

Figure 9A:
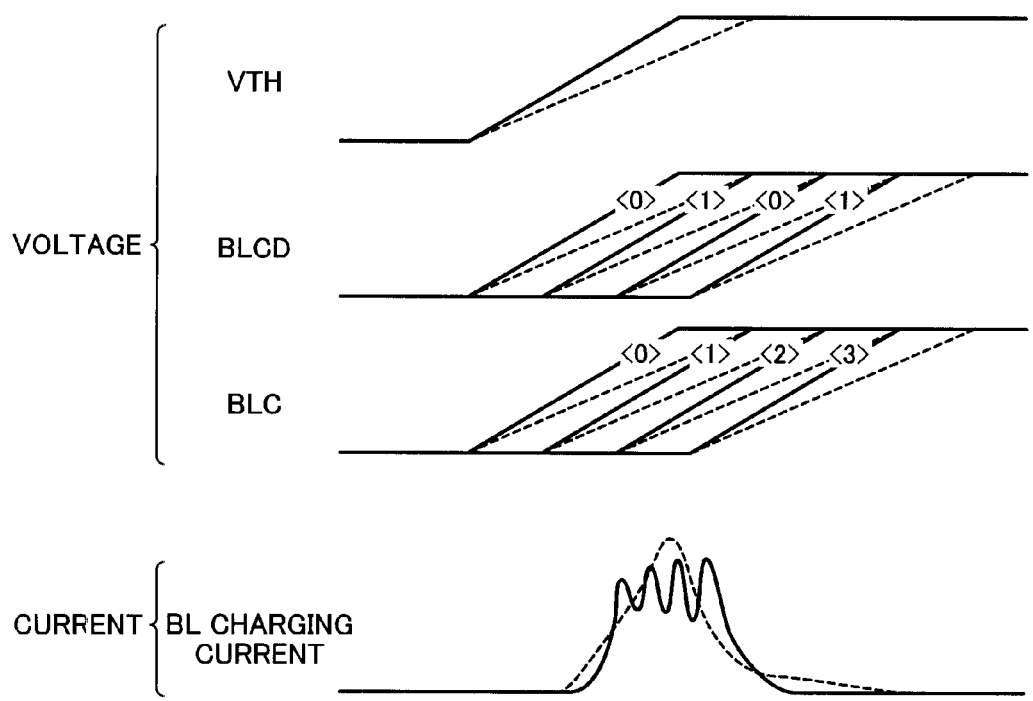
FIG. 9A shows current and voltage waveforms for explaining a bit line charging operation of the nonvolatile semiconductor memory device according to the first embodiment.

FIG. 9A shows current and voltage waveforms for explaining the bit line charging operation of the NAND type flash memory when the rise of the power supplies VTH is accelerated. The broken lines in the voltage waveforms of FIG. 9A correspond to the voltage waveforms shown in FIG. 5A. The broken line in the current waveform of FIG. 9A indicates the current amount of the comparative example. As indicated by the solid lines in the voltage waveforms of FIG. 9A, when the rising speed of the power supplies VTH is accelerated, the maximum value of the currents to flow when charging the bit lines BL increases to about the maximum value of the comparative example. However, the operation of charging the bit lines BL is completed faster because the rising speed of the power supplies VTH is accelerated. As is clear from this, the NAND type flash memory according to the present embodiment can choose to shorten the time taken for charging the bit lines BL. The rising speed of the power supplies VTH can be adjusted in accordance with the requirement for the tolerable maximum value of the current amount, etc. by using a trimming circuit (not shown).

When the number of planes which operate simultaneously changes, it is possible to provide a configuration for enabling to adjust the width of varying the timings of starting charging in accordance with the number of planes. FIG. 9B shows that the width (Δt1, Δt2, Δt3) of varying the timings at which the bit line clamp voltage lines BLC rise is changed based on the number of planes to be selected. When the number of planes to be selected is small, the peak value of the bit line charging currents can be suppressed. Therefore, it is possible to cause the bit line clamp voltage lines BLC to rise at short widths. On the other hand, when the number of planes to be selected is large, the peak value of the bit line charging currents becomes high. Therefore, the bit line clamp voltage lines BLC are caused to rise at longer widths. The width of varying the timings of starting charging can be adjusted arbitrarily by configuring the delay circuits DC in the signal sending unit 51 shown in FIG. 4 to have a variable delay period. Needless to say, the widths (Δt1, Δt2, Δt3) of varying the timings at which the bit line clamp voltage lines BLC rise may be the same, because also in this case, the time taken for charging the bit lines BL becomes short if the number of planes is small.

Second Embodiment

Configuration of Nonvolatile Semiconductor Memory Device According to Second Embodiment Next, a nonvolatile semiconductor memory device according to a second embodiment of the present invention will be explained with reference to FIG. 10A and FIG. 10B. The nonvolatile semiconductor memory device according to the second embodiment is different from the first embodiment in the layout and configuration of the bit line clamp voltage line driver 5. The nonvolatile semiconductor memory device according to the present embodiment is also different from the first embodiment in not including the delay selecting circuit 6.

Figure 10A:
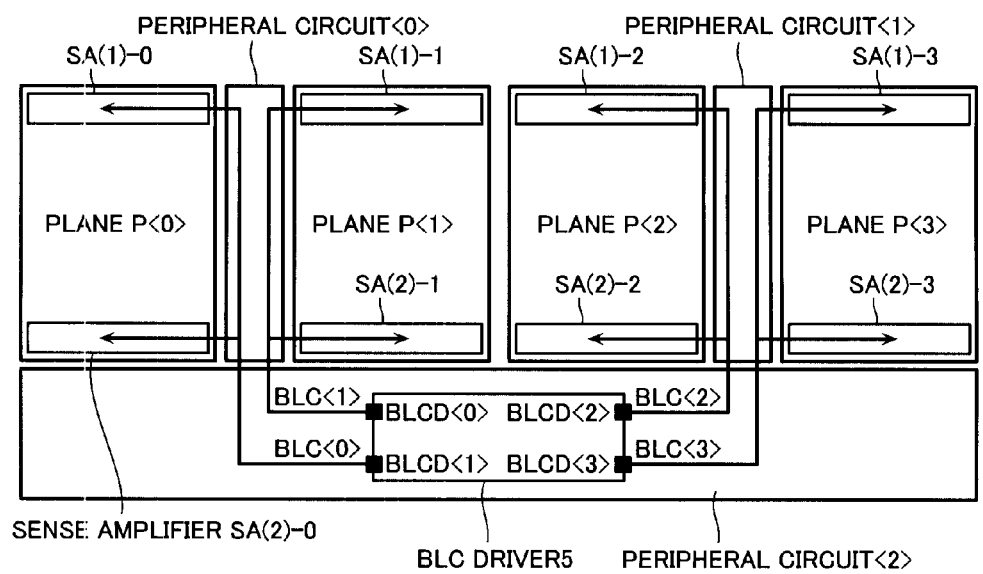
FIG. 10A is a diagram explaining the layout of circuits in a nonvolatile semiconductor memory device according to a second embodiment.

FIG. 10A is a diagram explaining the layout of circuits in the NAND type flash memory according to the present embodiment. FIG. 10B is a circuit diagram of the bit line clamp voltage line driver 5 of the NAND type flash memory according to the present embodiment.

As shown in FIG. 10A, the bit line clamp voltage line driver 5 according to the present embodiment is provided in a peripheral circuit <2>. The bit line clamp voltage line driver 5 is provided as one circuit common to all the planes P<0> to P<3>. The bit line clamp voltage line driver 5 includes drive lines BLCD<0> to BLCD<3>. The drive lines BLCD<0> to BLCD<3> are connected to the bit line clamp voltage lines BLC<0> to BLC<3> in the sense amplifiers SA(1)-0 to SA(1)-3 and SA(2)-0 to SA(2)-3 of the planes P<0> to P<3> respectively.

Figure 10B:
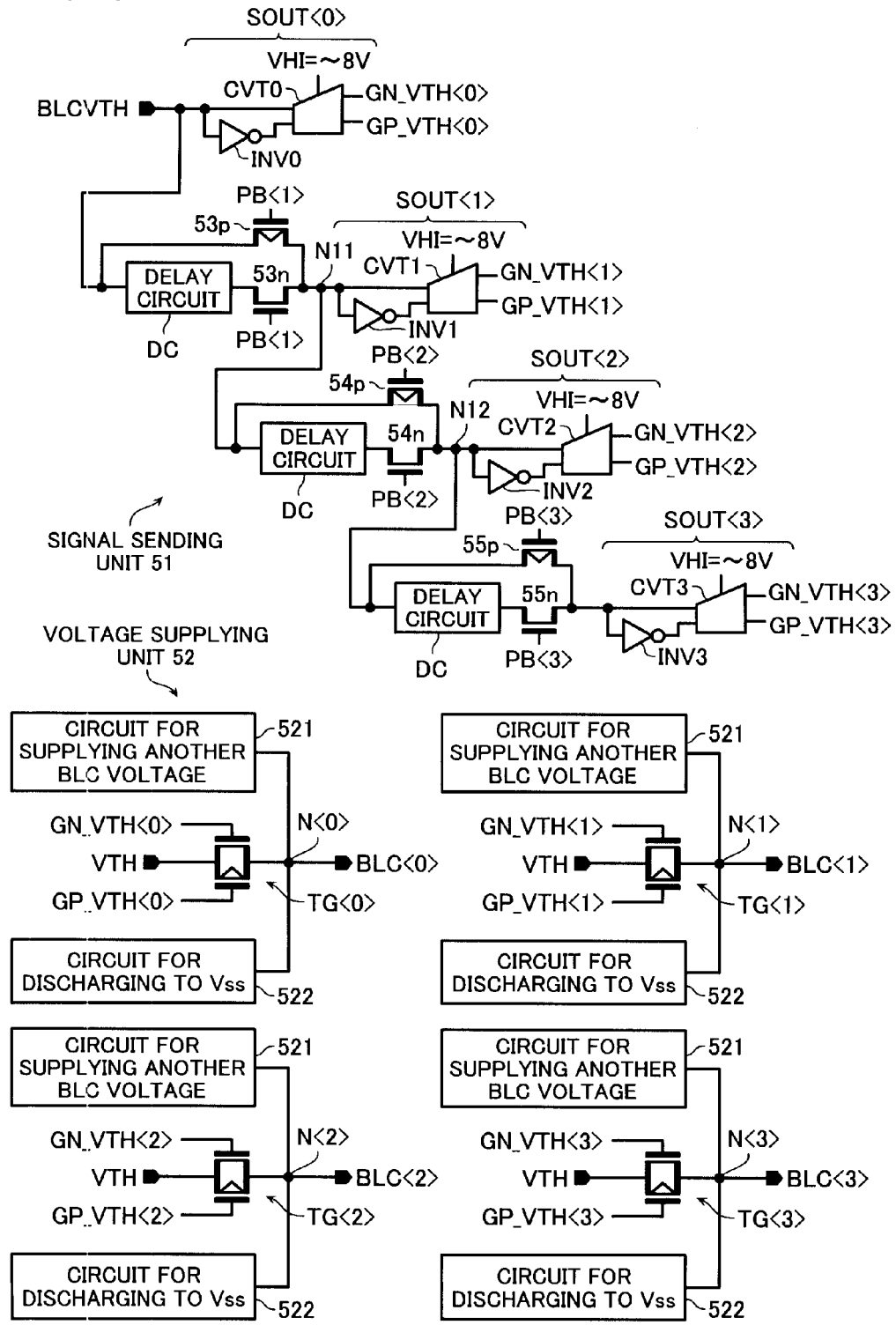
FIG. 10B is a circuit diagram of a control circuit of the nonvolatile semiconductor memory device according to the second embodiment.

As shown in FIG. 10B, the bit line clamp voltage line driver 5 includes: a signal sending unit 51 configured to delay a signal for starting applying the voltage VTH by a certain time period among the planes P<0> to P<3> when applying the voltage VTH to the bit line clamp voltage lines BLC; and a voltage supplying unit 52 configured to apply the voltage to the drive lines BLCD connected to the bit line clamp voltage lines BLC based on the signal for starting applying the voltage VTH.

A signal output unit SOUT<0> outputs complementary signals GN_VTH<0> and GP_VTH<0> based on the signal BLCVTH for starting applying the voltage VTH to the bit line clamp voltage lines BLC and its inverse signal /BLCVTH.

The signal BLCVTH is output to a node N11 via either a switch PMOS transistor 53p or a switch NMOS transistor 53n. The path to the node N11 via the switch transistor 53n is provided with a delay circuit DC. A signal PB<1> is input to the gates of the switch transistors 53p and 53n. When the signal PB<1> is "H", the switch transistor 53n becomes electrically conductive. When the signal PB<1> is "L", the switch transistor 53p becomes electrically conductive. The signal BLCVTH output to the node N11 is input to a signal output unit SOUT<1>. The signal output unit SOUT<1> outputs complementary signals GN_VTH<1> and GP_VTH<1> based on the signal BLCVTH output to the node N11 and its inverse signal /BLCVTH.

The signal BLCVTH output to the node N11 is output to a node N12 via either a switch PMOS transistor 54p or a switch NMOS transistor 54n. The path to the node N12 via the switch transistor 54n is provided with a delay circuit DC. A signal PB<2> is input to the gates of the switch transistors 54p and 54n. When the signal PB<2> is "H", the switch transistor 54n becomes electrically conductive. When the signal PB<2> is "L", the switch transistor 54p becomes electrically conductive. The signal BLCVTH output to the node N12 is input to a signal output unit SOUT<2>. The signal output unit SOUT<2> outputs complementary signals GN_VTH<2> and GP_VTH<2> based on the signal BLCVTH output to the node N12 and its inverse signal /BLCVTH.

The signal BLCVTH output to the node N12 is input to a signal output unit SOUT<3> via either a switch PMOS transistor 55p or a switch NMOS transistor 55n. The path to the signal output unit SOUT<3> via the switch transistor 55n is provided with a delay circuit DC. A signal PB<3> is input to the gates of the switch transistors 55p and 55n. When the signal PB<3> is "H", the switch transistor 55n becomes electrically conductive. When the signal PB<3> is "L", the switch transistor 55p becomes electrically conductive. The signal output unit SOUT<3> outputs complementary signals GN_VTH<3> and GP_VTH<3> based on the signal BLCVTH input thereto via the switch transistor 55p or 55n and its inverse signal /BLCVTH.

The signals PB<1> to PB<3> are signals indicative of selection of any plane P as in the first embodiment. When the plane P<i> (i=0 to 3) is selected, the signal PB<i> becomes "H". In the NAND type flash memory, the number of planes P which operate simultaneously is any of one, two, and four. When operating one plane P, the signal PB<0> becomes "H". When operating two planes P, the signal PB<0> and the signal PB<1> (or the signal PB<2>) become "H". When operating four planes P, the signals PB<0> to PB<3> become "H".

In any plane P corresponding to the signal that becomes "H" among the signals PB<1> to PB<3>, the timing of starting charging the bit lines BL is delayed. In any plane P corresponding to the signal that becomes "L" among the signals PB<1> to PB<3>, the timing of starting charging the bit lines BL is not delayed. The bit line clamp voltage line driver 5 according to the present embodiment can also charge the bit lines BL by changing the timing of starting charging the bit lines BL in any plane P selected from a plurality of planes.

In the voltage supplying unit 52, the signals GN_VTH<0> to GN_VTH<3> and the complementary signals GP_VTH<0> to GP_VTH<3> output by the signal output units SOUT<0> to SOUT<3> are sent to the transfer gates TG<0> to TG<3> respectively. The bit line clamp voltage line driver 5 according to the present embodiment applies the voltage VTH to the drive lines BLCD<0> to BLCD<3> based on the signals GN_VTH<0> to GN_VTH<3> and the complementary signals GP_VTH<0> to GP_VTH<3>. This voltage VTH is applied to the bit line clamp voltage lines BLC<0> to BLC<3> in the sense amplifiers SA in the respective planes P<0> to P<3>.

[Operation of Nonvolatile Semiconductor Memory Device According to Second Embodiment]

Figure 11:
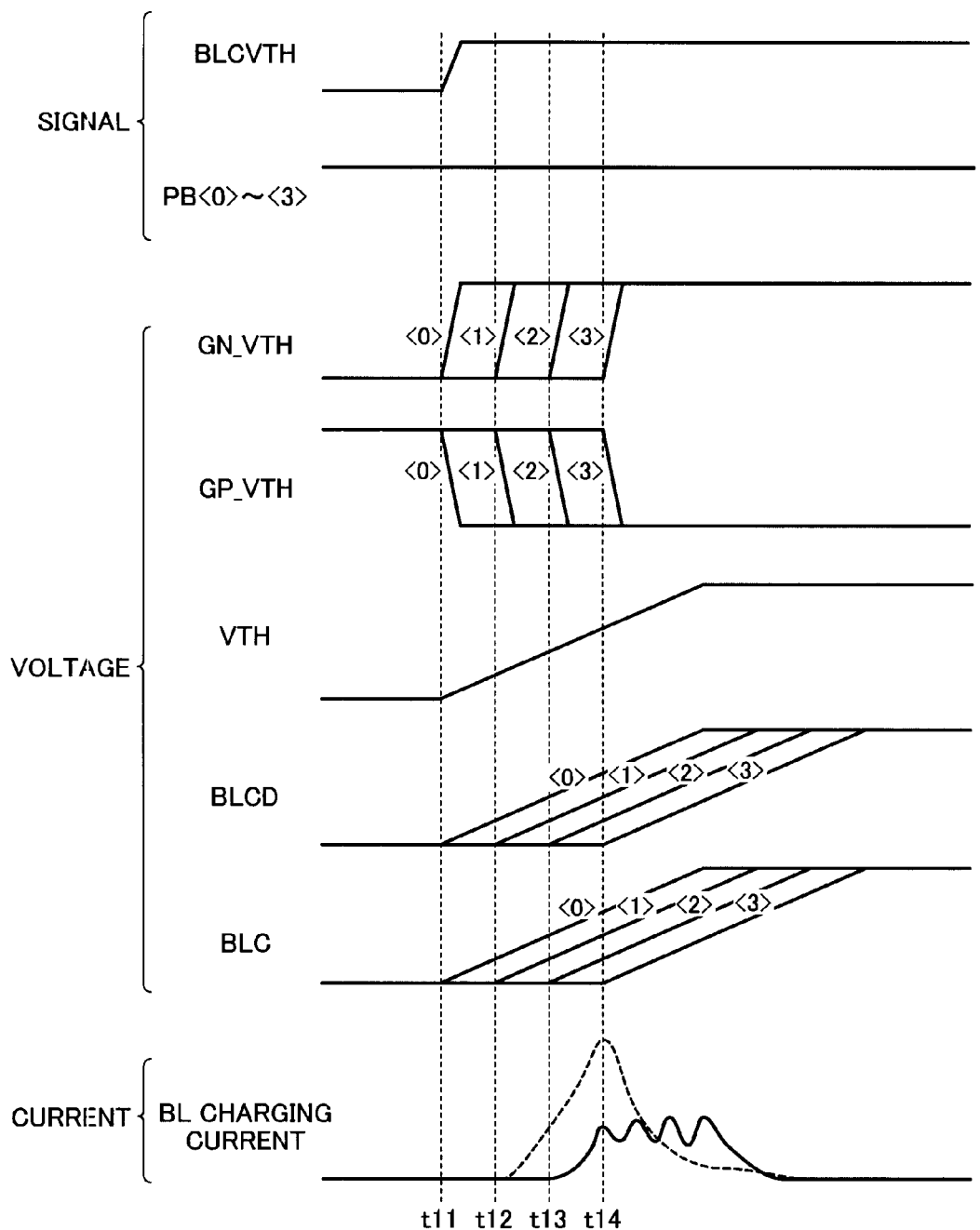
FIG. 11 shows current and voltage waveforms for explaining a bit line charging operation of the nonvolatile semiconductor memory device according to the second embodiment.

The NAND type flash memory according to the present embodiment executes a bit line charging operation by using the control circuit having the above-described configuration. FIG. 11 shows current and voltage waveforms for explaining the bit line charging operation of the NAND type flash memory according to the present embodiment. Here, it is assumed that all the planes P<0> to P<3> are selected so that a write operation may be executed simultaneously and that the signals PB<1> to PB<3> are all set to "H".

At a timing t11, in the bit line clamp voltage line driver 5, the signal BLCVTH for starting applying the voltage VTH to the bit line clamp voltage lines BLC is turned to "H". Also at the timing t11, the power supplies VTH are started to rise.

In the bit line clamp voltage line driver 5 shown in FIG. 10B, the states of the signals GN_VTH<0> and GP_VTH<0> are changed without a delay (at the timing t11). The transfer gate TG<0> becomes electrically conductive in response to the signals GN_VTH<0> and GP_VTH<0>, thus applying the voltage VTH to the drive line BLCD<0>.

In the bit line clamp voltage line driver 5 shown in FIG. 10B, the signal PB<1> is "H". Hence, the states of the signals GN_VTH<1> and GP_VTH<1> are changed via the switch transistor 53n with a delay corresponding to one delay circuit DC (at a timing t12). After the delay period corresponding to one delay circuit DC has passed, the transfer gate TG<1> becomes electrically conductive in response to the signals GN_VTH<1> and GP_VTH<1>, thus applying the voltage VTH to the drive line BLCD<1>.

Likewise, in the bit line clamp voltage line driver 5 shown in FIG. 10B, the signal PB<2> is "H". Hence, the states of the signals GN_VTH<2> and GP_VTH<2> are changed via the switch transistors 53n and 54n with a delay corresponding to two delay circuits DC (at a timing t13). After the delay period corresponding to two delay circuits DC has passed, the transfer gate TG<2> becomes electrically conductive in response to the signals GN_VTH<2> and GP_VTH<2>, thus applying the voltage VTH to the drive line BLCD<2>.

Then, as the signal PB<3> is "H", the states of the signals GN_VTH<3> and GP_VTH<3> are changed via the switch transistors 53n, 54n, and 55n with a delay corresponding to three delay circuits DC (at a timing t14). After the delay period corresponding to three delay circuits DC has passed, the transfer gate TG<3> becomes electrically conductive in response to the signals GN_VTH<3> and GP_VTH<3>, thus applying the voltage VTH to the drive line BLCD<3>.

The voltage VTH is applied to the bit line clamp voltage lines BLC in the respective planes P<0> to P<3> through the drive lines BLCD<0> to BLCD<3> of the bit line clamp voltage line driver 5. As a result of the above-described operation of the bit line clamp voltage line driver 5, the voltage VTH is applied to the bit line clamp voltage lines BLC<0>, BLC<1>, BLC<2>, and BLC<3> in this order

[Effect of Nonvolatile Semiconductor Memory Device According to Second Embodiment]

Also in the bit line charging operation according to the present embodiment, the timings at which the bit line clamp voltage lines BLC<0>, BLC<1>, BLC<2>, and BLC<3> rise are varied among the planes P<0> to P<3>. Therefore, currents flow through the bit lines BL at different timings as shown in FIG. 11, and the total current amount does not become excessively large.

FIG. 12 shows current waveform diagrams indicating the results of actually executing the bit line charging operation of the NAND type flash memory according to the first and second embodiments and the bit line charging operation of the NAND type flash memory according to the comparative example.

FIG. 12 (Comparative Example) shows the currents that flow through the bit lines BL of the planes P<0> to P<3> when the bit line charging operation is executed in the NAND type flash memory according to the comparative example. Since the voltage is applied to the bit lines BL in the respective planes P<0> to P<3> simultaneously, the waveforms of the currents flowing through the bit lines BL overlap.

FIG. 12 (Embodiment A) shows the currents that flow through the bit lines BL of the planes P<0> to P<3> when the bit line charging operation is executed in the NAND type flash memory according to the first or second embodiment. In the bit line charging operation according to the embodiment, the timings at which the bit line clamp voltage lines BLC<0>, BLC<1>, BLC<2>, and BLC<3> rise are different in the different planes P<0> to P<3>. Therefore, the timings at which the currents start to flow through the bit lines vary among the planes P<0> to P<3>.

FIG. 12 (Embodiment B) shows the currents that flow through the bit lines BL of the planes P<0> to P<3> when the delay period of the delay circuit DC in the NAND type flash memory according to the first or second embodiment is set longer than that of the example of FIG. 12 (Embodiment A). In this case, the timings at which the currents start to flow through the bit lines in the respective planes P<0> to P<3> are varied more largely than in the example of FIG. 12 (Embodiment A).

FIG. 12 (States of Currents Added) shows waveforms obtained by adding the currents that flow through the bit lines BL of the respective planes P<0> to P<3> together, in the waveform diagrams of FIG. 12 (Comparative Example), (Embodiment A), and (Embodiment B) respectively. As shown in FIG. 12 (States of Currents Added), the NAND type flash memory according to the embodiment can obtain a smaller maximum value of the currents flowing in all the planes P<0> to P<3> than that obtained by the comparative example. In the bit line charging operation, the more largely the timings at which the bit line clamp voltage lines BLC<0> to BLC<3> rise are varied, the more the maximum value of the currents flowing through all the planes can be suppressed. However, when the timings at which the bit line clamp voltage lines BLC rise are varied, the time necessary for charging the bit lines BL becomes longer. Therefore, it is necessary to determine the delay period of the delay circuit DC based on the relationship between the maximum value tolerable for the currents flowing through all the planes and the time period tolerable for charging the bit lines BL.

Third Embodiment

Next, a nonvolatile semiconductor memory device according to a third embodiment of the present invention will be explained. The nonvolatile semiconductor memory device according to the first and second embodiments varies the timings of applying the voltage VTH to the bit line clamp voltage lines BLC<0> to BLC<3> among the planes P<0> to P<3> in the bit line charging operation. As compared with this, the nonvolatile semiconductor memory device according to the third embodiment varies the speed at which the voltage VTH to be applied to the bit line clamp voltage lines BLC<0> to BLC<3> rises among the planes P<0> to P<3>.

[Configuration of Nonvolatile Semiconductor Memory Device According to Third Embodiment]

Figure 13A:
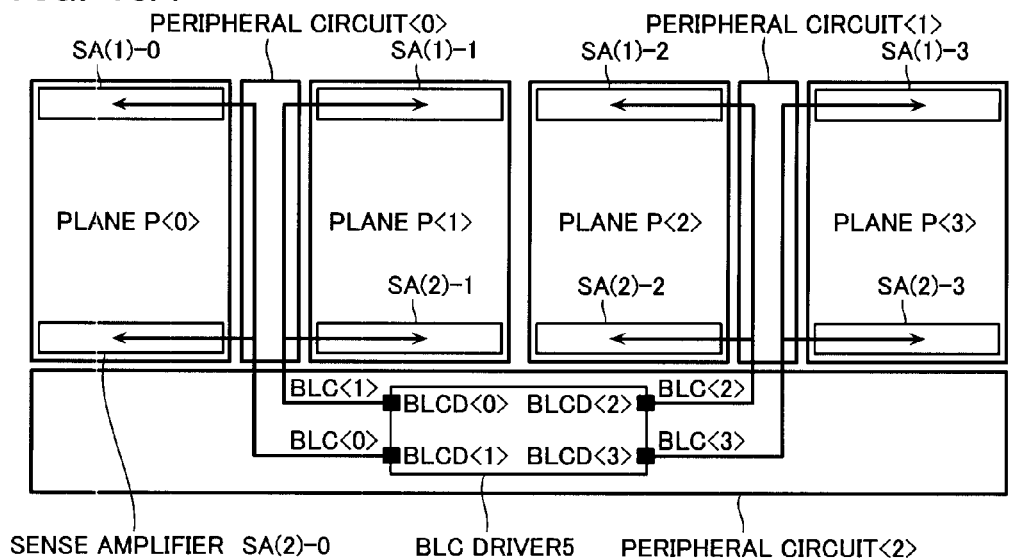
FIG. 13A is a diagram explaining the layout of circuits in a nonvolatile semiconductor memory device according to a third embodiment.

The configuration of a NAND type flash memory according to the present embodiment will be explained with reference to FIG. 13A to FIG. 14. FIG. 13A is a diagram explaining the layout of circuits in the NAND type flash memory according to the present embodiment.

As shown in FIG. 13A, a bit line clamp voltage line driver according to the present embodiment is provided in a peripheral circuit <2>. The bit line clamp voltage line driver 5 is provided as one circuit common to all planes P<0> to P<3>. The bit line clamp voltage line driver 5 includes drive lines BLCD<0> to BLCD<3>. The drive lines BLCD<0> to BLCD<3> are connected to the bit line clamp voltage lines BLC<0> to BLC<3> in the sense amplifiers SA(1)-0 to SA(1)-3 and SA(2)-0 to SA(2)-3 of the planes P<0> to P<3> respectively.

Figure 13B:
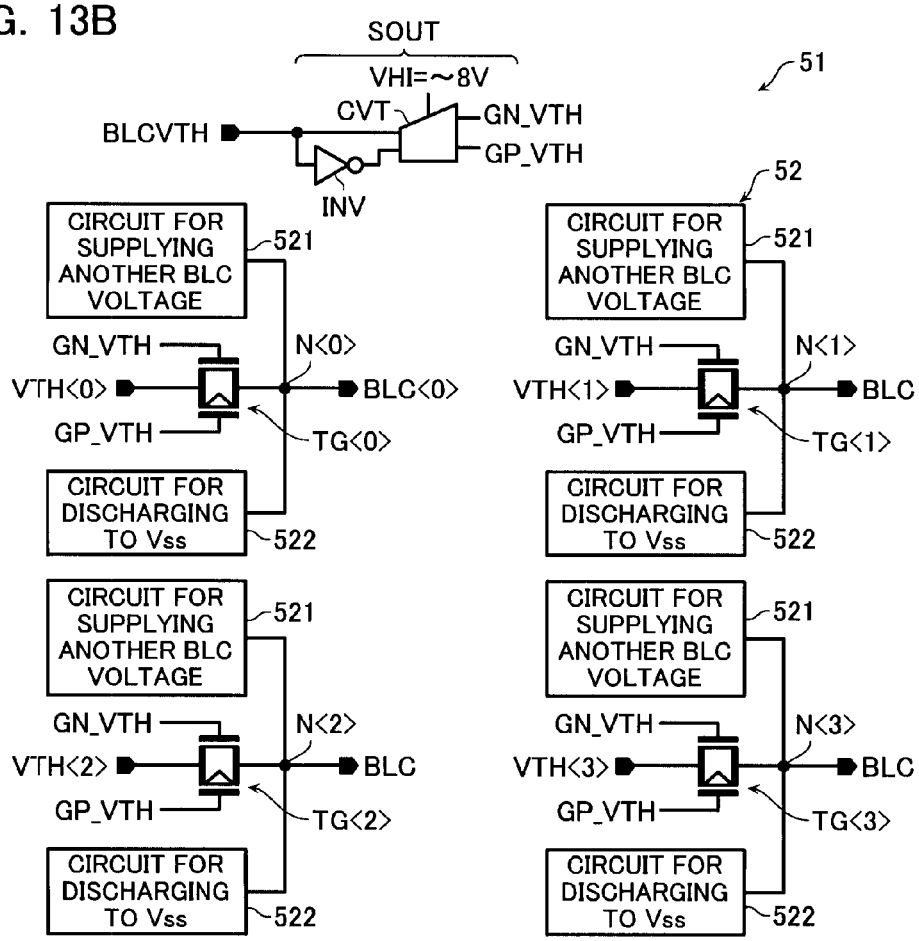
FIG. 13B is a circuit diagram of a control circuit of the nonvolatile semiconductor memory device according to the third embodiment.

FIG. 13B is a circuit diagram of the bit line clamp voltage line driver 5 of the NAND type flash memory according to the present embodiment.

The bit line clamp voltage line driver 5 includes: a signal sending unit 51 configured to send a signal BLCVTH for starting applying the voltage when applying the voltage VTH to the bit line clamp voltage lines BLC; and a voltage supplying unit 52 configured to apply the voltage to the drive lines BLCD connected to the bit line clamp voltage lines BLC based on the signal BLCVTH.

In the signal sending unit 51, a signal output unit SOUT outputs complementary signals GN_VTH and GP_VTH based on the signal BLCVTH for starting applying the voltage VTH to the bit line clamp voltage lines BLC and its inverse signal /BLCVTH.

In the voltage supplying unit 52, the complementary signals GN_VTH and GP_VTH output by the signal output unit SOUT are sent to the transfer gates TG<0> to TG<3> respectively. In the bit line clamp voltage line driver 5 according to the present embodiment, the drive lines BLCD<0> to BLCD<3> are connected to power supplies VTH<0> to VTH<3> based on the complementary signals GN_VTH and GP_VTH. The voltages VTH<0> to VTH<3> transferred by the power supplies VTH<0> to VTH<3> are applied to the bit line clamp voltage lines BLC in the sense amplifiers SA of the planes P<0> to P<3> respectively. Here, the power supplies VTH<0> to VTH<3> have different rising speeds respectively.

Next, driver circuits DRV for controlling the rising speeds of the power supplies VTH will be explained with reference to FIG. 14. FIG. 14 is a circuit diagram of a driver circuit DRV for controlling the rising speed of a power supply VTH of the NAND type flash memory.

Figure 14:
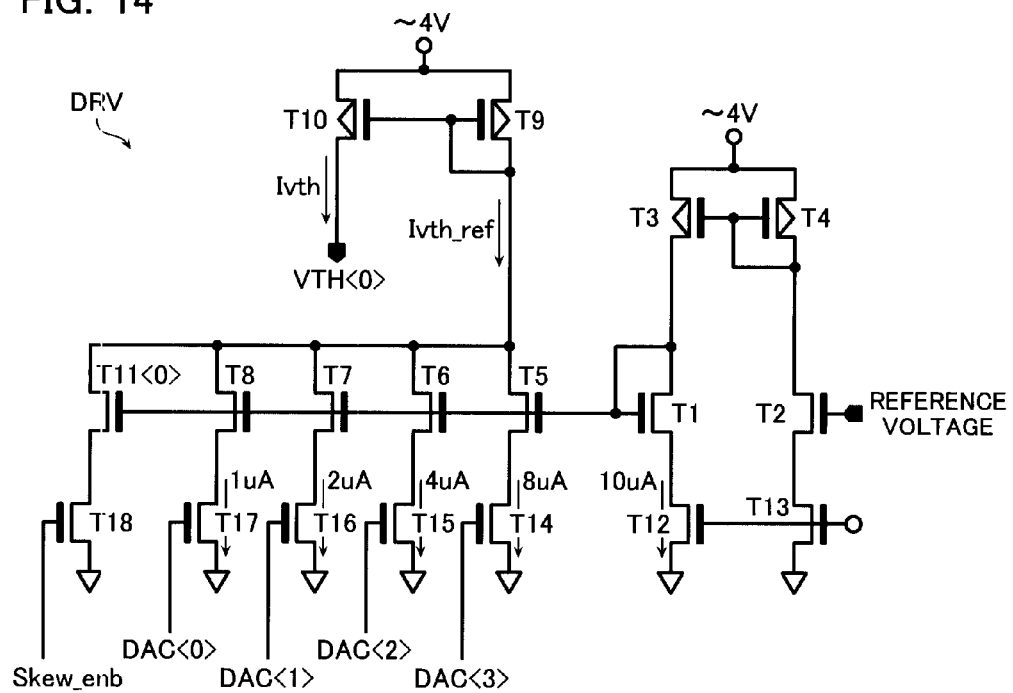
FIG. 14 is a circuit diagram of a control circuit of the nonvolatile semiconductor memory device according to the third embodiment.

The driver circuit DRV shown in FIG. 14 is connected to the power supply VTH<0> shown in FIG. 13B to control the rising speed of the power supply VTH<0>. The power supplies VTH<0> to VTH<3> are connected to corresponding driver circuits DRV respectively. The driver circuits have substantially the same configuration. Therefore, the following explanation will be provided by employing the configuration of the driver circuit DRV connected to the power supply VTH<0> as an example.

PMOS transistors T3 and T4 have substantially the same characteristic and size as each other and are connected to each other as a current mirror. A current based on a reference voltage flows from the transistor T4 to an NMOS transistor T13 via an NMOS transistor T2. This current is mirrored to flow from the transistor T3 to an NMOS transistor T12 via a transistor T1. At this time, by adjusting the size of the transistors T1 and T2, it is possible to set the source-drain current of the transistor T1 to, for example, 10 µA.

The driver circuit DRV includes PMOS transistors T9 and T10 connected to each other as a current mirror. The transistor T10 has its drain connected to the power supply VTH<0> and causes a current Ivth to flow. The transistor T9 causes a current Ivth_ref having the same current value as the current Ivth to flow. The driver circuit DRV adjusts the rising speed of the power supply VTH<0> by changing the current Ivth by changing the value of the current Ivth_ref.

NMOS transistors T5 to T8 are parallel-connected to the drain of the transistor T9. The gates of the transistors T5 to T8 are connected to the gate and drain of the transistor T1. When the channel length of the NMOS transistor T5 is set to, for example, 10/8 that of the transistor T1, the source-drain current of the transistor T5 becomes 8 µA. Likewise, when the channel lengths of the NMOS transistors T6, T7, and T8 are set to 10/4, 10/2, and 10/1 that of the transistor T1, the source—drain currents of the respective transistors become 4 µA, 2 µA, and 1 µA.

A signal DAC<3:0> input to the gates of transistors T14 to T17 controls whether or not to cause these currents to flow through the transistors T5 to T8. The current Ivth_ref can be selected from a range of 0 µA to 15 µA based on the signal DAC<3:0>. The range from which this current is selected can be arbitrarily changed by changing the channel lengths of the transistors T5 to T8.

Here, the channel width of the PMOS transistor T10 is set to, for example, sixteen times as large as the channel width of the PMOS transistor T9. Hence, the current Ivth becomes sixteen times as large as the current Ivth_ref selected by the signal DAC<3:0>. That is, with this transistor size, the current value of the current Ivth that determines the rising speed of the power supply VTH becomes 16×Ivth_ref[µA].

In the driver circuit DRV according to the present embodiment, the drain of the transistor T9 is further connected to an NMOS transistor T11<0> as shown in FIG. 14. The current Ivth that determines the rising speed of the power supply VTH also reflects an amount of increase of the current Ivth_ref due to a current flowing through this transistor T11. The signal Skew_enb input to the gate of a transistor T18 controls whether or not to cause a current to flow through the transistor T11.

In the first and second embodiments, the signal Skew_enb was a signal for controlling whether or not to execute the operation of varying the timings of charging the bit lines BL among the planes P. In the present embodiment, the signal Skew_enb is used as a signal for controlling whether or not to execute an operation of varying the rising speeds of the power supplies VTH among the planes P. When the signal Skew_enb is "H", the operation of varying the rising speeds of the power supplies VTH is executed.

The configuration of the driver circuit DRV connected to the power supply VTH<0> has been explained above. The configuration of the driver circuits DRV connected to the other power supplies VTH<1> to VTH<3> is substantially the same as the driver circuit DRV shown in FIG. 14. However, the transistors T11 of the respective circuits have different channel lengths. The driver circuits DRV connected to the power supplies VTH<0> to VTH<3> are configured such that the transistors T11<0>, T11<1>, T11<2>, and T11<3> have ascending channel lengths in this order, i.e., such that the channel length of the transistor T11<0> is the smallest and the channel length of the transistor T11<3> is the largest.

When the channel lengths of the transistors T11<0> to T11<3> are set in this way, the driver circuit DRV connected to the power supply VTH<0> causes the largest current Ivth_ref, if the same signal DAC<3:0> is input to the respective driver circuits DRV. Therefore, the power supply VTH<0> rises the fastest, based on the current Ivth_reflecting this current Ivth_ref. The rising speeds descend in the order of the power supply VTH<1> and the power supply VTH<2>, and the power supply VTH<3> rises the most slowly.

[Operation of Nonvolatile Semiconductor Memory Device According to Third Embodiment]

Figure 15:
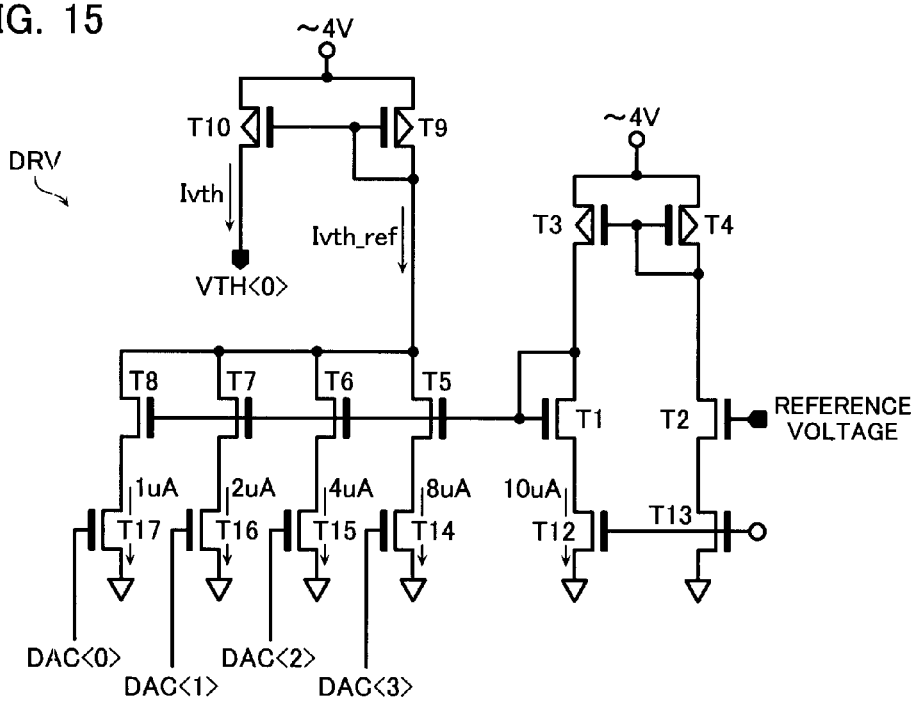
FIG. 15 is a circuit diagram of a control circuit of a nonvolatile semiconductor memory device according to a comparative example
Figure 16:
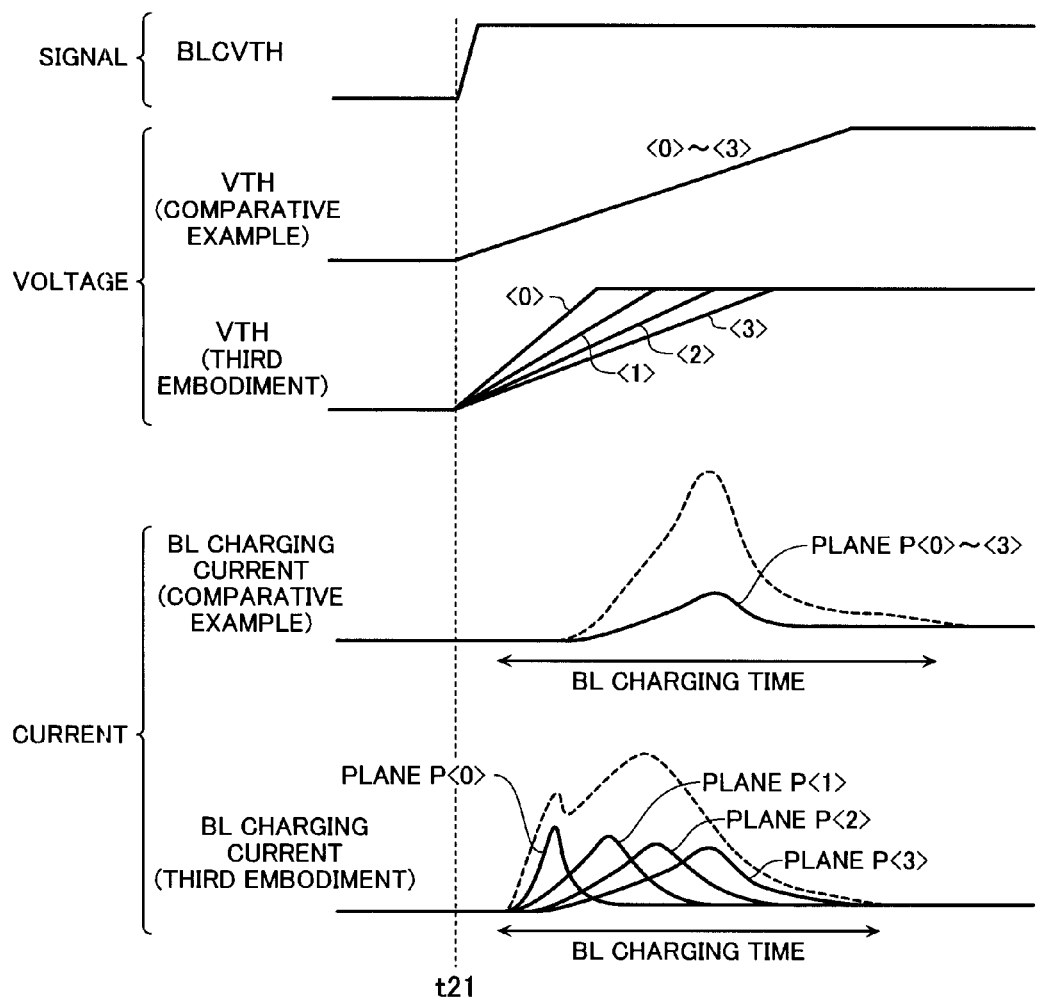
FIG. 16 shows current and voltage waveforms for explaining a bit line charging operation of the nonvolatile semiconductor memory device according to the third embodiment.

The NAND type flash memory according to the present embodiment executes a bit line charging operation by using the driver circuits DRV having the above configuration. The bit line charging operation of the NAND type flash memory according to the present embodiment will be explained with reference to a comparative example. FIG. 15 is a circuit diagram of a driver circuit DRV that controls the rising speed of a power supply VTH of a NAND type flash memory according to a comparative example. FIG. 16 shows current and voltage waveforms for explaining the bit line charging operation of the NAND type flash memory according to the present embodiment.

The driver circuit DRV according to the comparative example shown in FIG. 15 is different from the driver circuit DRV shown in FIG. 14 in not including the transistor T11. Therefore, the driver circuits DRV according to the comparative example cause the power supplies VTH<0> to VTH<3> to rise at the same rising speed, if the same signal DAC<3:0> is input to them.

As shown in FIG. 16, at a timing t21, the signal BLCVTH for starting applying the voltage VTH to the bit line clamp voltage lines BLC is turned to "H" in the bit line clamp voltage line driver 5. In the bit line clamp voltage line driver 5, the states of the signals GN_VTH and GP_VTH are changed without a delay via the signal output unit SOUT.

At the timing t21, the power supplies VTH<0> to VTH<3> are started to rise. The rising steepness of the power supplies VTH<0> to VTH<3> is determined by the signal DAC<3:0> input to the driver circuits DRV of the power supplies VTH and the channel lengths of the transistors T11 in the driver circuits DRV.

In the bit line clamp voltage line driver 5 according to the present embodiment, the transistors T11 in the driver circuits DRV connected to the power supplies VTH<0> to VTH<3> respectively have different channel lengths. Therefore, the power supplies VTH started to rise by the drivers DRV rise at different rising speeds (see the voltage VTH (Third Embodiment) of FIG. 16). On the other hand, in the bit line clamp voltage line driver 5 according to the comparative example, the power supplies VTH<0> to VTH<3> started to rise by the driver circuits DRV rise at the same rising speed (see the voltage VTH (Comparative Example) of FIG. 16).

The voltage VTH is applied to the drive lines BLCD<0> to BLCD<3> from the power supplies VTH having such rising speeds, via the transfer gates TG<0> to TG<3> that become electrically conducive in response to the signals GN_VTH and GP_VTH. Then, the voltages VTH<0> to VTH<3> are applied to the bit line clamp voltage lines BLC in the respective planes P<0> to P<3> through the drive lines BLCD<0> to BLCD<3>.

In the bit line charging operation, the faster the rising speed of the voltage VTH is, the faster the rising speed of the voltage of the bit lines BL is. The faster the rising speed of the bit lines BL is, the larger current flows through the bit lines BL, thus completing the bit line charging operation faster. Under the effect of the operation of the driver circuits DRV according to the present embodiment, the largest current flows through the bit lines BL in the plane P<0> to complete the bit line charging operation fast, and then the planes P<1>, P<2>, and P<3> are finished with the bit line charging operation in this order (see the current waveforms of (Third Embodiment) of FIG. 16). On the other hand, in the bit line charging operation using the driver circuits DRV according to the comparative example, the currents flowing through the bit lines BL of the respective planes P<0> to P<3> have the same level, thus completing the bit line charging operation simultaneously (see the current waveform of (Comparative Example) of FIG. 16).

[Effect of Nonvolatile Semiconductor Memory Device According to Third Embodiment]

In the bit line charging operation according to the present; embodiment, the rising speeds of the voltage VTH to be applied to the bit line clamp voltage lines BLC<0> to BLC<3> are varied among the planes P<0> to P<3>. Therefore, the current; value of the currents to flow when charging the bit lines BL and The time at which the charging operation of the bit lines BL is completed are varied among the planes P<0> to P<3> as shown in FIG. 16. As a result, the total current amount in the planes P<0> to P<3> does not become excessively large.

Figure 17:
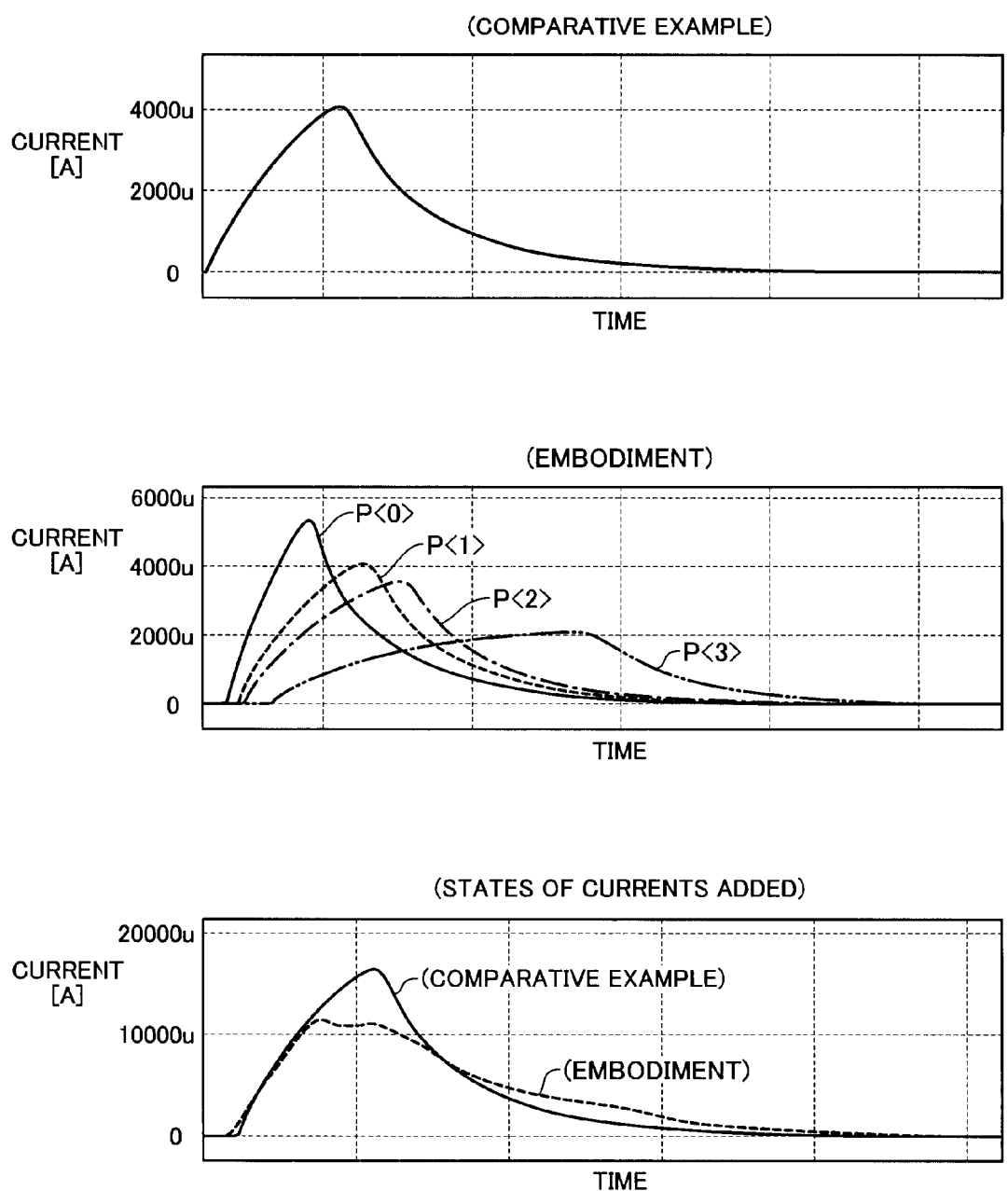
FIG. 17 shows current waveforms for explaining a bit line charging operation of the nonvolatile semiconductor memory device according to the third embodiment.

FIG. 17 shows current waveform diagrams indicating the results of actually executing the bit line charging operation of the NAND type flash memory according to the third embodiment and the bit line charging operation of the NAND type flash memory according to the comparative example.

FIG. 17 (Comparative Example) shows the currents that flow through the bit lines BL of the planes P<0> to P<3> when the bit line charging operation is executed in the NAND type flash memory according to the comparative example. Since the voltage is applied to the bit lines BL in the respective planes P<0> to P<3> simultaneously, the waveforms of the currents flowing through the bit lines BL overlap.

FIG. 17 (Embodiment) shows the currents that flow through the bit lines BL of the planes P<0> to P<3> when the bit line charging operation is executed in the NAND type flash memory according to the third embodiment. In the bit line charging operation according to the embodiment, the rising speeds of the voltages VTH to be applied to the bit line clamp voltage lines BLC<0> to BLC<3> are varied among the planes P<0> to P<3>. Therefore, as shown in FIG. 17 (Embodiment), the current value of the currents to flow when charging the bit lines BL and the time at which the charging operation of the bit lines BL is completed are varied among the planes P<0> to P<3>.

FIG. 17 (States of Currents Added) shows waveforms obtained by adding the currents that flow through the bit lines BL of the respective planes P<0> to P<3> together, in the waveform diagrams of FIG. 17 (Comparative Example) and FIG. 17 (Embodiment) respectively. As shown in FIG. 17 (States of Currents Added), the NAND type flash memory according to the embodiment can obtain a smaller maximum value of the currents flowing in all the planes P<0> to P<3> than that obtained by the comparative example. In the bit line charging operation, the more largely the rising speeds of the voltages VTH to be applied to the bit line clamp voltage lines BLC<0> to BLC<3> are varied, the more the maximum value of the currents flowing through all the planes can be suppressed. However, when the rising speeds of the bit line clamp voltage lines BLC are varied, the time necessary for charging the bit lines BL becomes longer. Therefore, it is necessary to determine the rising speeds of the voltages VTH based on the relationship between the maximum value tolerable for the currents flowing in all the planes and the time period tolerable for charging the bit lines BL.

[Others]

Though the embodiments of the present invention have been described, the present invention is not limited to these embodiments, but various modifications, additions, combinations, etc. can be made thereonto within the scope of the spirit of the invention. For example, in the third embodiment, the driver circuits DRV connected to the power supplies VTH<0> to VTH<3> are configured such that the transistors T11<0> to T11<3> have different channel lengths. However, the rising speeds of the power supplies VTH may be varied by controlling the signal DAC<3:0> for the planes P<0> to P<3> individually.

In the bit line charging operation, the more largely the timings or the rising speeds of the voltages VTH to be applied to the bit line clamp voltage lines BLC<0> to BLC<3> are varied, the more the maximum value of the currents flowing in all the planes can be suppressed. However, when the rising timings or the rising speeds of the bit line clamp voltage lines BLC are varied, the time necessary for charging the bit liens BL becomes long. Therefore, there may be such a setting that when the maximum value of the currents flowing in all the planes is a value in a tolerable range, the operation of varying the rising timings or the rising speeds of the bit line clamp voltage lines BLC is not executed, while when the maximum value of the currents flowing in all the planes exceeds a certain value, the operation of varying the rising timings or the rising speeds of the bit line clamp voltage lines BLC is executed. In this case, these operations can be switched based on a relationship between the maximum value of the currents flowing in all the planes and the time tolerable for charging the bit lines BL.

It is only necessary that the number of memory cells Mn connected in series between the select transistors ST1 and ST2 should be a plural number (a power of two), which is not limited to 32. It is not necessary that data stored in a memory cell should be binary data, but it may be four-value data, eight-value data, etc.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device, comprising:
    a plurality of planes;
    a memory cell array provided in each of the plurality of planes and configured as an array of NAND cell units each including a memory string and select transistors connected to both ends of the memory string respectively, the memory string including a plurality of nonvolatile memory cells connected in series;
    word lines each connected to a control gate electrode of the nonvolatile memory cells;
    bit lines each connected to a first end of the NAND cell units;
    a source line connected to second ends of the NAND cell units; and
    a control circuit configured to control a write operation of charging the bit lines up to a certain voltage value, and then setting data in the nonvolatile memory cells to a certain threshold voltage distribution state,
    the control circuit including:
    first transistors, each of the first transistors provided between a first power supply and each of the bit lines and configured to charge the bit line up to the certain voltage value based on a voltage applied to a gate thereof;
    a second power supply connected to the gate of the first transistor and configured to make the first transistor electrically conductive when charging the bit line in the plane;
    a signal sending unit configured to output a start signal for starting a bit line charging operation; and
    a voltage supplying unit configured to apply a voltage to the gates of the first transistors from the second power supplies based on the start signal,
    the control circuit being configured to be capable of executing an operation of charging the bit lines in the write operation by varying timings of starting charging the bit lines among the plurality of planes, and
    the signal sending unit being configured to be capable of adjusting whether or not to delay the start signal for each of the plurality of planes.

2. The nonvolatile semiconductor memory device according to claim 1,
    wherein the signal sending unit includes a delay circuit configured to delay the start signal by a certain time period.

3. The nonvolatile semiconductor memory device according to claim 1,
    wherein the signal sending unit varies a delay period of the start signal according to the number of the plurality of planes.

4. The nonvolatile semiconductor memory device according to claim 1,
    wherein the control circuit varies rising speeds of the second power supplies.

5. A nonvolatile semiconductor memory device, comprising:
    a plurality of planes;
    a memory cell array provided in each of the plurality of planes, and configured as an array of NAND cell units each including a memory string and select transistors connected to both ends of the memory string respectively, the memory string including a plurality of nonvolatile memory cells connected in series;
    word lines each connected to a control gate electrode of the nonvolatile memory cells;
    bit lines each connected to a first end of the NAND cell units;
    a source line connected to second ends of the NAND cell units; and
    a control circuit configured to control a write operation of charging the bit lines up to a certain voltage value, and then setting data in the nonvolatile memory cells to a certain threshold voltage distribution state,
    the control circuit including:
    first transistors, each of the first transistors provided between a first power supply and each of the bit lines and configured to charge the bit line up to the certain voltage value based on a voltage applied to a gate thereof;
    a second power supply connected to the gate of the first transistor and configured to make the first transistor electrically conductive when charging the bit line in the plane;
    a signal sending unit configured to output a start signal for starting a bit line charging operation; and a voltage supplying unit configured to apply a voltage to the gates of the first transistors from the second power supplies based on the start signal, the control circuit being configured to be capable of executing the write operation by:

charging the bit lines by varying timings of starting charging the bit lines among the plurality of planes;

transferring voltages of the bit lines via the select transistors to memory cell channels having the memory strings formed therein; and applying certain types of voltages to the word lines connected to a selected one of the nonvolatile memory cells and to unselected ones of the nonvolatile memory cells respectively, and the signal sending unit being configured to be capable of adjusting whether or not to delay the start signal for each of the plurality of planes.

6. The nonvolatile semiconductor memory device according to claim 5, wherein the signal sending unit includes a delay circuit configured to delay the start signal by a certain time period.

7. The nonvolatile semiconductor memory device according to claim 5, wherein the signal sending unit varies a delay period of the start signal according to the number of the plurality of planes.

8. The nonvolatile semiconductor memory device according to claim 5, wherein the control circuit varies rising speeds of the second power supplies.

9. A nonvolatile semiconductor memory device, comprising:

a plurality of planes;

a memory cell array provided in each of the plurality of planes, and configured as an array of NAND cell units each including a memory string and select transistors connected to both ends of the memory string respectively, the memory string including a plurality of nonvolatile memory cells connected in series;

word lines each connected to a control gate electrode of the nonvolatile memory cells;

bit lines each connected to a first end of the NAND cell units;

a source line connected to second ends of the NAND cell units; and a control circuit configured to control a write operation of charging the bit lines up to a certain voltage value, and then seating data in the nonvolatile memory cells to a certain threshold voltage distribution state, the control circuit including:

first transistors, each of the first transistors provided between a first power supply and each of the bit lines and configured to charge the bit line up to the certain voltage value based on a voltage applied to a gate thereof;

a second power supply connected to the gate of the first transistor and configured to make the first transistor electrically conductive when charging the bit line in the plane; and a driver circuit configured to control an operation of charging the bit lines, the control circuit being configured to be capable of executing the operation of charging the bit lines in the write operation by varying rising speeds of voltages of the bit lines among the plurality of planes, and the driver circuit being configured to be capable of selecting whether or not to execute an operation of varying rising speeds of voltages of the bit lines.

10. The nonvolatile semiconductor memory device according to claim 9, wherein the driver circuit is configured to vary rising speeds of the second power supplies by controlling currents to be supplied to the second power supplies.

11. The nonvolatile semiconductor memory device according to claim 10, wherein the driver circuit includes a plurality of transistors having different channel lengths.

12. The nonvolatile semiconductor memory device according to claim 9, wherein the control circuit includes:

a signal sending unit configured to output a start signal for starting a bit line charging operation; and a voltage supplying unit configured to apply a voltage to the gates of the first transistors from the second power supplies based on the start signal.

13. The nonvolatile semiconductor memory device according to claim 9, wherein the control circuit is capable of executing a write operation after charging the bit lines up to the certain voltage value by:

transferring voltages of the bit lines via the select transistors to memory cell channels having the memory strings formed therein; and applying certain types of voltages to word lines connected to a selected one of the nonvolatile memory cells and to unselected ones of the nonvolatile memory cells respectively.

* * * * *